United States Patent
Sugiura

(10) Patent No.: US 10,620,493 B2
(45) Date of Patent: Apr. 14, 2020

(54) ELECTRO-OPTICAL DEVICE AND ELECTRONIC APPARATUS

(71) Applicant: SEIKO EPSON CORPORATION, Tokyo (JP)

(72) Inventor: Yukihiro Sugiura, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/225,012

(22) Filed: Dec. 19, 2018

(65) Prior Publication Data
US 2019/0187524 A1 Jun. 20, 2019

(30) Foreign Application Priority Data
Dec. 20, 2017 (JP) ................. 2017-243575

(51) Int. Cl.
*G02F 1/1362* (2006.01)
*H01L 29/786* (2006.01)
*H01L 27/12* (2006.01)

(52) U.S. Cl.
CPC .. *G02F 1/136209* (2013.01); *G02F 1/136227* (2013.01); *H01L 27/1248* (2013.01); *H01L 29/78633* (2013.01); *H01L 29/78675* (2013.01); *G02F 1/136286* (2013.01)

(58) Field of Classification Search
CPC ......... G02F 1/136209; G02F 1/133707; H01L 27/1248
See application file for complete search history.

(56) References Cited

U.S. PATENT DOCUMENTS

| | | | |
|---|---|---|---|
| 2002/0008831 A1* | 1/2002 | Shigeta | G02F 1/13439 349/143 |
| 2006/0163451 A1* | 7/2006 | Park | H01L 27/14621 250/208.1 |

FOREIGN PATENT DOCUMENTS

JP  3991569 B2  10/2007

* cited by examiner

*Primary Examiner* — Lucy P Chien
(74) *Attorney, Agent, or Firm* — Oliff PLC

(57) ABSTRACT

Between a first substrate and a pixel electrode, a transmissive-type electro-optical device includes a light shielding body extending along an edge of the pixel electrode in plan view, a transmissive wall portion extending along the edge of the pixel electrode in plan view and covering the light shielding body, and an insulating transmissive body filling a recessed portion surrounded by the wall portion. The transmissive body has a refractive index larger than that of the wall portion. Thus, a boundary surface between the wall portion and the transmissive body serves as a reflective surface, and the transmissive body forms a wave guide. The transmissive body includes a first transmissive film and a second transmissive film laminated on the first transmissive film on a side opposite to the first substrate.

9 Claims, 15 Drawing Sheets

ELECTRO-OPTICAL DEVICE AND ELECTRONIC APPARATUS

BACKGROUND

1. Technical Field

The invention relates to an electro-optical device, which include pixel electrodes formed on one surface side of a first substrate and an electronic apparatus.

2. Related Art

In an electro-optical device (liquid crystal device) to be used as, for example, a light valve of a projection-type display device, an electro-optical layer (liquid crystal layer) is arranged between a first substrate and a second substrate. The first substrate is transmissive and is provided with transmissive pixel electrodes, pixel switching elements, and light shielding bodies such as wiring. The second substrate is transmissive and is formed with a common electrode. In such an electro-optical device, light entered from one of the first substrate and the second substrate is modulated from the time of entry to the time of exit from the other substrate, to display an image. Thus, in the first substrate, the light shielding bodies are arranged to extend along outer edges of the pixel electrodes, and regions surrounded by the light shielding bodies correspond to opening regions which the light can pass through.

Meanwhile, for the electro-optical device, technology of preventing the light from being deviated from the opening regions is demanded for the purpose of, for example, improvement of light utilization efficiency. For example, in the technology disclosed in Japanese Patent No. 3,991,569, the following mode is conceivable. That is, in an inter-layer insulating film formed of a silicon oxide film, which is formed on a first substrate, regions corresponding to opening regions are recessed portions. A silicon nitride film is formed along inner walls of the recessed portions. Recessed portions formed on a surface side of the silicon nitride film are filled with a silicon oxide film. In such a mode, a boundary surface between the silicon nitride film and the silicon oxide film functions as a reflective surface because a refractive index of the silicon nitride film and a refractive index of the silicon oxide film are different from each other. Thus, a wave guide is formed in the opening regions. With this, for example, even when the light entering from the second substrate side advances obliquely toward outside of the opening regions (side on which the light shielding bodies are positioned), the light is reflected toward the opening regions at the boundary surface between the silicon nitride film and the silicon oxide film. In this manner, the light utilization efficiency can be improved (see FIG. 10 and FIG. 11 in Japanese Patent No. 3,991,569).

However, in the case where the recessed portions are filled with the silicon nitride film and the silicon oxide film similarly to the configuration disclosed in Japanese Patent No. 3,991,569, when the recessed portions have a large aspect ratio, there is a problem in that voids may remain in the recessed portions due to a coverage effect at the time of film formation. For example, in the case where the silicon nitride film is formed along the inner walls of the recessed portions, and then the recessed portions formed on the surface side of the silicon nitride film are filled with the silicon oxide film, there is a problem in that the voids may remain in the silicon oxide film. The presence of such voids is not preferred because the voids cause the light to be reflected in a direction that does not contribute to display.

SUMMARY

An advantage of the invention is to provide an electro-optical device in which voids are less liable to be formed in transmissive bodies even when recessed portions formed between a first substrate and pixel electrodes are filled with the transmissive bodies, a manufacturing method for an electro-optical device, and an electronic apparatus.

In order to achieve the above-mentioned advantage, an aspect of an electro-optical device according to the invention includes a first substrate being transmissive, a pixel electrode being transmissive and provided on one surface side of the first substrate, a light shielding body configured to extend between the first substrate and the pixel electrode and include an edge overlapping with the pixel electrode in plan view from a direction perpendicular to the first substrate, a wall portion with an insulation property and configured to cover the light shielding body between the first substrate and the pixel electrode, and extend along an edge of the pixel electrode in the plan view, and a transmissive body with an insulation property and a refractive index higher than a refractive index of the wall portion, the transmissive body being provided in a recessed portion surrounded by the wall portion, wherein the transmissive body includes a first transmissive film and a second transmissive film formed on the first transmissive film on a side opposite to the first substrate.

In the aspect of the invention, on the first substrate, the light shielding body including the edge overlapping with the pixel electrode in plan view is covered with the insulating wall portion, and the recessed portion surrounded by the wall portion includes the transmissive body having the refractive index larger than the refractive index of the wall portion. Therefore, the boundary surface between the transmissive body and the wall portion is present extending along an edge of the pixel electrode in plan view. Between the first substrate and the pixel electrode, the wave guide is formed to overlap with the pixel electrode in plan view. Therefore, even when light advances obliquely toward the wall portion, the light is reflected on the boundary surface between the wall portion and the transmissive body toward the transmissive body side, and contributes to display. Thus, the light utilization efficiency can be improved. Further, the transmissive body in the recessed portion has a multi-layer structure including the first transmissive film and the second transmissive film. Thus, when the first transmissive film is formed, even in a case where a defect in a recessed shape is formed in the first transmissive layer, the first transmissive layer is partially removed in the thickness direction to make the defect disappear, or to make the defect in the recessed shape easily filled with the second transmissive film. Further, when the second transmissive film is formed, the first transmissive film causes the recessed portion to be reduced in aspect ratio. Therefore, under a state in which the second transmissive film is formed to provide the transmissive body in the recessed portion, voids are less liable to remain in the transmissive body. Thus, the light reflection in the voids is suppressed, and the light utilization efficiency can be improved.

In an aspect of the invention, a mode in which the first transmissive film has a refractive index equal to a refractive index of the second transmissive film may be employed. In such mode, the reflection can be prevented on the boundary surface between the first transmissive film and the second transmissive film.

In an aspect of the invention, the following mode may be employed. That is, the wall portion includes a plurality of inter-layer insulating films provided between the first substrate and the pixel electrode, and the light shielding body includes a wiring or an electrode provided between two or more layers of the plurality of inter-layer insulating films.

In an aspect of the invention, the following mode may be employed. That is, the light shielding body includes a semiconductor layer for a pixel switching element provided between adjacent layers of the plurality of inter-layer insulating films. In such mode, the semiconductor layer for the pixel switching element is covered with the wall portion. Accordingly, the light toward the semiconductor layer is reflected on the boundary surface between the wall portion and the transmissive body. Therefore, in the pixel switching element, an erroneous operation and the like due to photo-electric current is less liable to be caused.

In an aspect of the invention, the following mode may be employed. That is, a width of the wall portion is larger than a width of the light shielding body, and both sides of the light shielding body in a width direction are covered by the wall portion. In such mode, the light shielding body is not exposed on side surface of the wall portion. Thus, the light entering the transmissive body can be prevented from reflecting on the edge of the light shielding body and does not contribute to the display.

In an aspect of the invention, the following mode may be employed. That is, a boundary surface between the wall portion and the transmissive body is formed with an angle falling within a range of 90°±10° with respect to the first substrate. In such mode, the light is totally reflected easily on the boundary surface between the wall portion and the transmissive body. Thus, the light utilization efficiency can further be improved.

The electro-optical device according to an aspect of the invention may be configured as a liquid crystal device including a second substrate configured to face one surface of the first substrate, and a liquid crystal layer provided between the first substrate and the second substrate.

Another aspect of the invention is a manufacturing method for an electro-optical device, the electro-optical device including a first substrate being transmissive, a pixel electrode being transmissive and provided on one surface side of the first substrate, a light shielding body configured to extend between the first substrate and the pixel electrode and include an edge overlapping with the pixel electrode in plan view from a direction perpendicular to the first substrate, a wall portion having insulation property configured to cover the light shielding body between the first substrate and the pixel electrode, and extend along an edge of the pixel electrode in the plan view, and a transmissive body having insulation property and a refractive index higher than a refractive index of the wall portion, the transmissive body being provided in a recessed portion surrounded by the wall portion, the manufacturing method, during forming the light shielding body and the wall portion and then providing the transmissive body in the recessed portion, including the step including a first step of forming a first transmissive film in the recessed portion and then partially removing the first transmissive film in a thickness direction from the side opposite to the first substrate, and a second step of providing a second transmissive film on the first transmissive film, which remains in the recessed portion on the side opposite to the first substrate after the first step.

In the manufacturing method for an electro-optical device according to the aspect of the invention, on the first substrate, the light shielding body including the edge overlapping with the pixel electrode in plan view is covered with the wall portion, and the transmissive body having the refractive index larger than the refractive index of the wall portion is provided in the recessed portion surrounded by the wall portion. Therefore, the boundary surface between the transmissive body and the wall portion is present extending along an edge of the pixel electrode in plan view. Between the first substrate and the pixel electrode, the wave guide is formed to overlap with the pixel electrode in plan view. Therefore, even when light advances obliquely toward the wall portion, the light is reflected on the boundary surface between the wall portion and the transmissive body toward the transmissive body side, and contributes to display. Thus, the light utilization efficiency can be improved. Further, when the transmissive body is formed in the recessed portion, even in a case where a defect in a recessed shape is formed when the first transmissive film is formed in the first step, the first transmissive layer is partially removed in the thickness direction to make the defect disappear, or to make the defect in the recessed shape easily filled with the second transmissive film. Further, when the second transmissive film is formed in the second step, the first transmissive film causes the recessed portion to be reduced in aspect ratio. Therefore, under a state in which the second transmissive film is formed and the transmissive body is provided in the recessed portion, voids are less liable to be formed in the transmissive body. Thus, the light utilization efficiency can be improved with the light reflection suppressed by the voids.

In the manufacturing method for an electro-optical device according to the aspect of the invention, a mode in which the first transmissive film and the second transmissive film fill the recessed portion may be employed. Specifically, the mode in which the transmissive body has a two-layer structure including the first transmissive film and the second transmissive film may be employed.

In the manufacturing method for an electro-optical device according to the aspect of the invention, the following mode may be employed. That is, the first step includes a first film formation step of forming the first transmissive film in the recessed portion, a first resist layer formation step of forming a first resist layer on the first transmissive film on the side opposite to the first substrate, and a first etch-back step of performing etch-back to the first resist layer from a side opposite to the first substrate.

In the manufacturing method for an electro-optical device according to the aspect of the invention, the following mode may be employed. That is, in the first etch-back step, the etch-back is performed to remove an entirety of the first resist layer. In the manufacturing method for an electro-optical device according to the aspect of the invention, the following mode may be employed. That is, in the first etch-back step, the etch-back is performed to expose the first transmissive film from the first resist layer, and in the first step, after the first etch-back step, the first transmissive film exposed from the first resist layer is partially removed in the thickness direction by etching, and then the first resist layer is removed. In such manufacturing method for an electro-optical device, the following mode may be employed. That is, the first step is performed under a state in which a hard mask is provided on a surface of the wall portion on a side opposite to the first substrate.

In the manufacturing method for an electro-optical device according to the aspect of the invention, the following mode may be employed. That is, in the first etch-back step, the etch-back is stopped on an outer side with respect to the recessed portion, and the first transmissive film is partially removed in the thickness direction, and in the first step, after the first etch-back step, the first resist layer is removed.

In the manufacturing method for an electro-optical device according to the aspect of the invention, the following mode may be employed. That is, the second step includes a second film formation step of forming the second transmissive film on the first transmissive film, which remains in the recessed portion, on the side opposite to the first substrate after the first step, a second resist layer formation step of forming a second resist layer on the second transmissive film on a side opposite to the substrate, and a second etch-back step of flattening a surface of the second transmissive film on the side opposite to the first substrate by etch-back of the second resist layer from a side opposite to the first substrate.

The electro-optical device according to an aspect of the invention may be used for various electronic apparatuses. In a case where the electro-optical device according to an aspect of the invention is used for a projection-type display device among the electronic apparatuses, the projection-type display device includes a light source portion configured to emit light to be supplied to the electro-optical device and a projection optical system configured to project the light modulated by the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the drawings, description is made of Exemplary Embodiments of the invention. Further, in each of the drawings referred to below, to make each layer and member recognizable in terms of size on the drawings, each of the layers and members are illustrated with different scale each other. Further, in the following description, when description is made of layers formed on a first substrate, an upper layer side and a surface side refers to a side (side on which a second substrate is positioned) opposite to a side on which the first substrate is positioned, and a lower surface side refers to the side on which the first substrate is positioned. Further, in the following description, a plan view refers to a state of being viewed in a thickness direction being a direction perpendicular to the first substrate.

Exemplary Embodiment 1

Configuration of Electro-Optical Device

Figure 1:
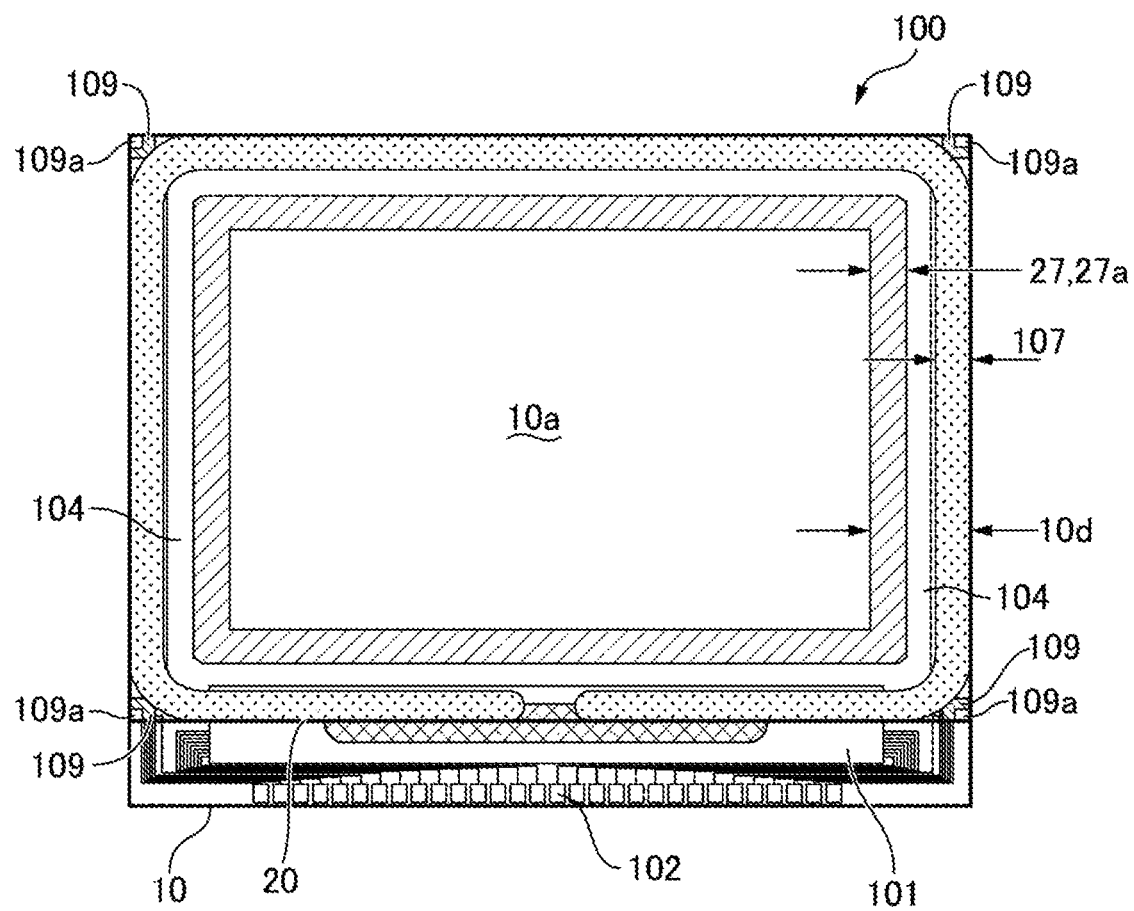
FIG. 1 is a plan view of an electro-optical device according to Exemplary Embodiment 1 of the invention.
Figure 2:
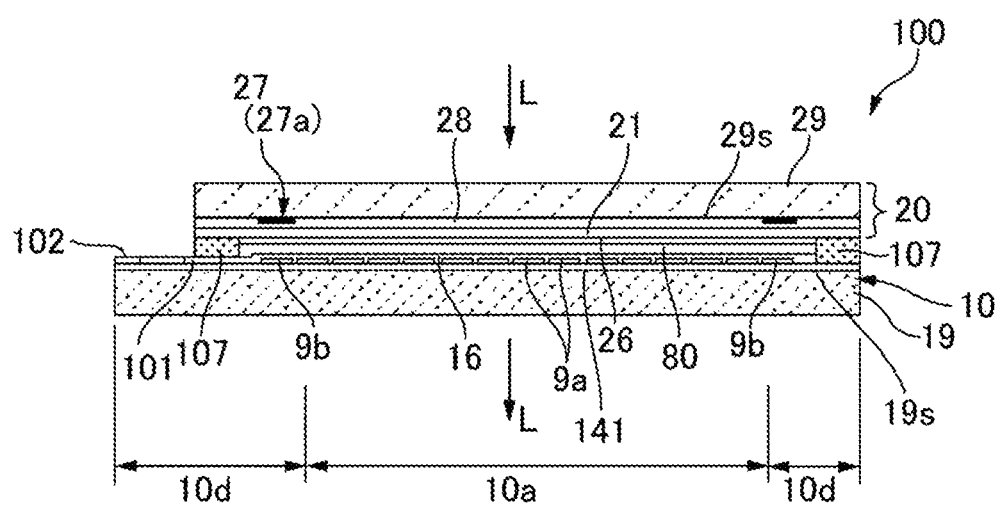
FIG. 2 is a cross-sectional view of the electro-optical device illustrated in FIG. 1.

FIG. 1 is a plan view of an electro-optical device 100 according to Exemplary Embodiment 1 of the invention. FIG. 2 is a cross-sectional view of the electro-optical device 100 illustrated in FIG. 1. As illustrated in FIG. 1 and FIG. 2, in the electro-optical panel 100, a first substrate 10 and a second substrate 20 that are transmissive are laminated together via a seal material 107 with a predetermined gap in between, and the first substrate 10 and the second substrate 20 face each other. The seal material 107 is provided along an outer edge of the second substrate 20 to have a frame-like shape, and an electro-optical layer 80 such as a liquid crystal layer is arranged in a region surrounded by the seal material 107 between the first substrate 10 and the second substrate 20. Therefore, the electro-optical device 100 is configured as a liquid crystal device, which operates in a Twisted Nematic (TN) mode or a Vertical Alignment (VA) mode. The seal material 107 is a photocurable adhesive or a photocurable and thermosetting adhesive, and further compounded with a gap material, such as a glass fiber or glass beads to maintain a distance between both the substrates to be a predetermined value. The first substrate 10 and the second substrate 20 both have a quadrangle shape, and in a substantially central portion of the electro-optical device 100, a display region 10a is provided as a quadrangle region. In accordance with those shapes, the seal material 107 is also formed in a substantially quadrangle shape, and a quadrangle frame-shaped peripheral region 10d is provided on an outer peripheral side of the seal member 107.

The first substrate 10 includes a transmissive substrate main body 19 such as a quartz substrate and a glass substrate. On one surface 19s side of the substrate main body 19 on the second substrate 20 side, on an outer side of the display region 10a, a data line driving circuit 101 and a plurality of terminals 102 are formed along one side of the first substrate 10. A scanning line driving circuit 104 is formed along other sides adjacent to the one side. A flexible wiring substrate (not illustrated) is connected to the terminals 102, and various potentials and various signals are input to the first substrate 10 via the flexible wiring substrate.

On the one surface 19s of the substrate main body 19, in the display region 10a, a plurality of transmissive pixel electrodes 9a, which include, for example, an Indium Tin Oxide (ITO) film or an Indium Zinc Oxide (IZO) film, and pixel switching elements (not illustrated in FIG. 2), which are electrically connected to the plurality of respective pixel electrodes 9a, are formed in matrix. A first orientation film 16 is formed on the second substrate 20 side with respect to the pixel electrodes 9a, and the pixel electrodes 9a are covered with the first orientation film 16.

The second substrate 20 includes a transmissive substrate main body 29 such as a quartz substrate and a glass substrate. On one surface 29s side, which faces the first substrate 10, of the substrate main body 29, transmissive common electrode 21 including, for example an ITO film or an IZO film, is formed. A second orientation film 26 is formed on the first substrate 10 side with respect to the common electrode 21. The common electrode 21 is formed on a substantially entire surface of the substrate main body 29, and covered with the second orientation film 26. On the one surface 29s side of the substrate main body 29, on the side opposite to the first substrate 10 with respect to the common electrode 21, a light shielding layer 27 which has light shielding property and includes resin, metal, or a metal compound, and a protection layer 28 are formed. The light shielding layer 27 is formed as, for example, a parting 27a having a frame shape extending along an outer peripheral edge of the display region 10a. In some cases, the light shielding layer 27 is formed as a black matrix in regions that overlap with regions in plan view, each of which is sandwiched between the pixel electrodes 9a adjacent to each other. In this embodiment, in regions of the peripheral region 10d of the first substrate 10, which overlap with the parting 27a in plan view, dummy pixel electrodes 9b formed simultaneously with the pixel electrodes 9a are formed.

The first orientation film 16 and the second orientation film 26 include a polymide film or an inorganic orientation film. In this embodiment, the first orientation film 16 and the second orientation film 26 are diagonally vapor-deposited films (inorganic orientation films) such as $SiO_x$ (x<2), $SiO_2$, $TiO_2$, MgO, $Al_2O_3$ and liquid crystal molecules, which are used for the electro-optical layer 80 and have negative dielectric anisotropy, and are oriented to be inclined. Therefore, the liquid crystal molecules form a predetermined angle with respect to the first substrate 10 and the second substrate 20. In this way, the electro-optical device 100 is configured as a liquid crystal device of a Vertical Alignment (VA) mode.

The first substrate 10 includes inter-substrate conduction electrodes 109 being formed in regions positioning outside the seal material 107 and overlapping with corner portions of the second substrate 20, so that electrical conduction is established between the first substrate 10 and the second substrate 20. Inter-substrate conduction materials 109a including conductive particles are arranged in the inter-substrate conduction electrodes 109. The common electrode 21 of the second substrate 20 is electrically connected to the first substrate 10 side via the inter-substrate conduction materials 109a and the inter-substrate conduction electrodes 109. Thus, a common potential is applied to the common electrode 21 from the first substrate 10 side.

In the transmissive electro-optical device 100 (transmissive liquid crystal device) configured as described above, the light entered from one of the first substrate 10 and the second substrate 20 into the electro-optical layer 80 is modulated from the time of entry to the time when the light passes through the other substrate and exits, to display an image. In this embodiment, as indicated by the arrows L, from the time when the light enters from the second substrate 20 to the time when the light passes through the first substrate 10 and exits, the light is modulated by the electro-optical layer 80 for each pixel. In this manner, an image is displayed.

Electrical Configuration of Electro-Optical Device

Figure 3:
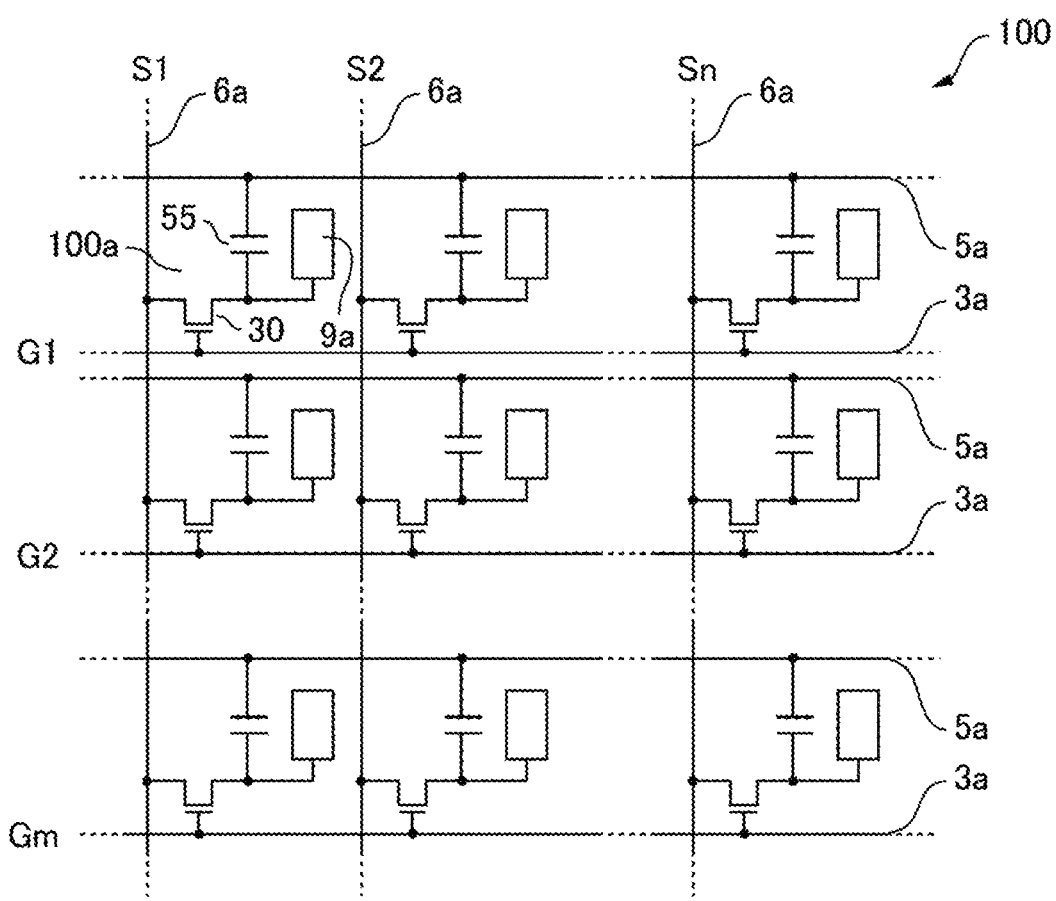
FIG. 3 is an explanatory diagram illustrating an electrical configuration of the electro-optical device illustrated in FIG. 1.

FIG. 3 is an explanatory diagram illustrating an electrical configuration of the electro-optical device 100 illustrated in FIG. 1. As illustrated in FIG. 3, in the display region 10a of the electro-optical device 100, for each of a plurality of pixels 100a formed in matrix, the pixel electrode 9a and a pixel switching element 30 configured to drive the pixel electrode 9a are formed. Data lines 6a configured to supply pixel signals S1, S2, . . . Sn are electrically connected to sources of the pixel switching elements 30. The pixel signals S1, S2, . . . Sn to be written in the data lines 6a may be sequentially supplied to the lines in the stated order, or may be supplied for each group including the plurality of data lines 6a that are adjacent to each other. Scanning lines 3a are electrically connected to gates of the pixel switching elements 30, and configured that scanning signals G1, G2, . . . Gm are sequentially applied to the scanning lines 3a in a pulse in the stated order at a predetermined timing. The pixel electrodes 9a are electrically connected to drains of the pixel switching elements 30, and write the pixel signals S1, S2, . . . Sn, which are supplied from the data lines 6a, in each of the pixels 100a at a predetermined timing by turning the pixel switching elements 30 into an on state for a certain time period. In this manner, the pixel signals S1, S2, . . . Sn that are written in the pixels 100a via the pixel electrodes 9a are retained for a certain time period together with the common electrode 21 of the second substrate 20 described with reference to FIG. 2. In the electro-optical layer 80, orientation and order of molecular assembly are changed by a level of voltage to be applied, and accordingly, the electro-optical layer 80 modulates the light and enables gradation display. Therefore, the light having contrast corresponding to the pixel signals S1, S2, . . . Sn exits from the electro-optical device 100.

Here, in some cases, in order to prevent the pixel signals S1, S2, . . . Sn retained for each of the pixels 100a from leaking, each retaining capacity 55 may be added in parallel with liquid crystal capacity formed between the pixel electrode 9a and the common electrode 21 by using a capacitance line 5a. In this case, the voltage of the pixel electrode 9a is retained by the retaining capacity 55 for a time period longer than a time period for which the source voltage is applied. With this, a charge retention property is improved, and the electro-optical device 100 of an active matrix type with a high contrast ratio can be achieved.

Specific Configuration of Pixel

Figure 4:
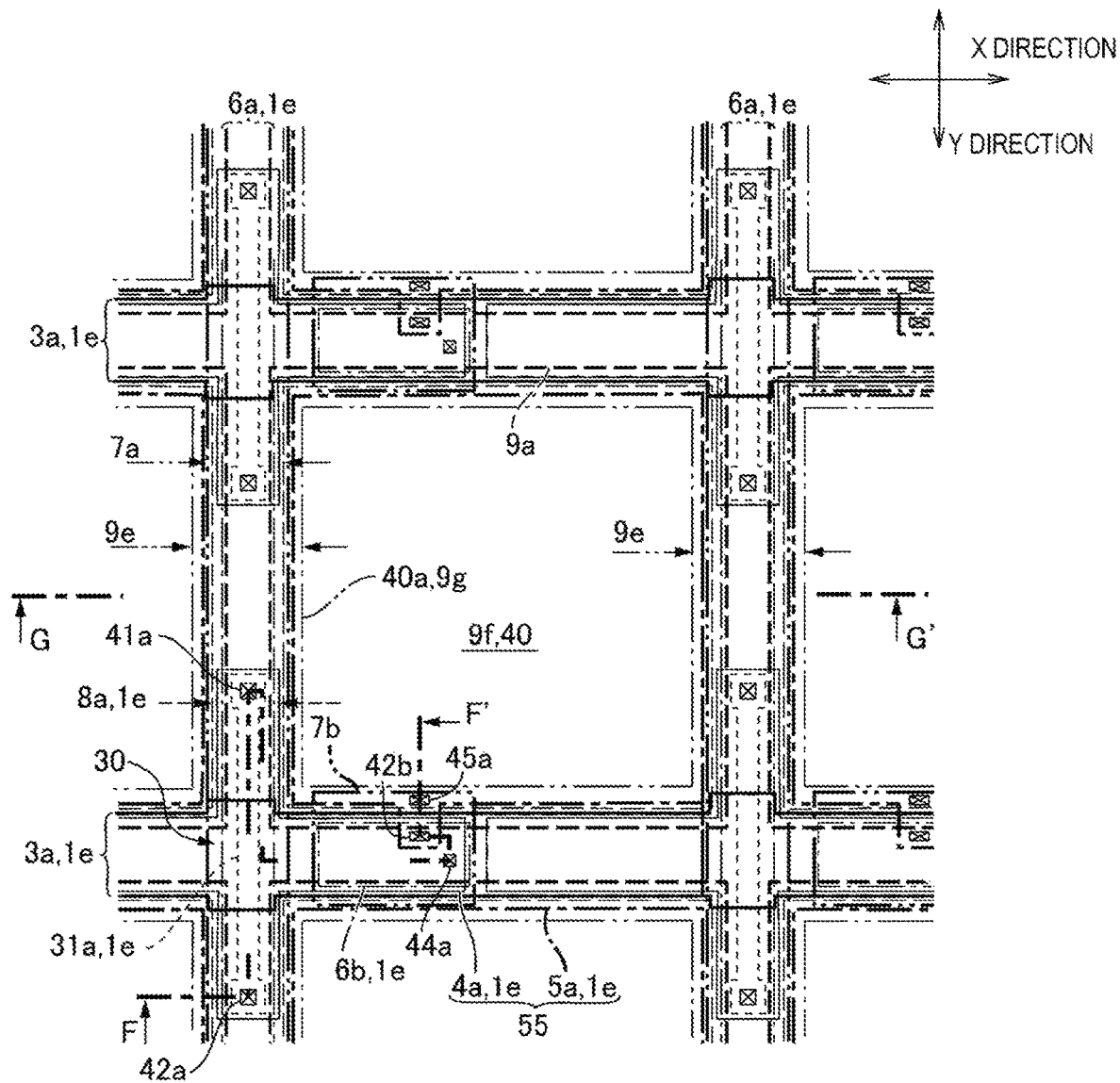
FIG. 4 is a plan view of a plurality of pixels that are adjacent to each other in the electro-optical device illustrated in FIG. 1.
Figure 5:
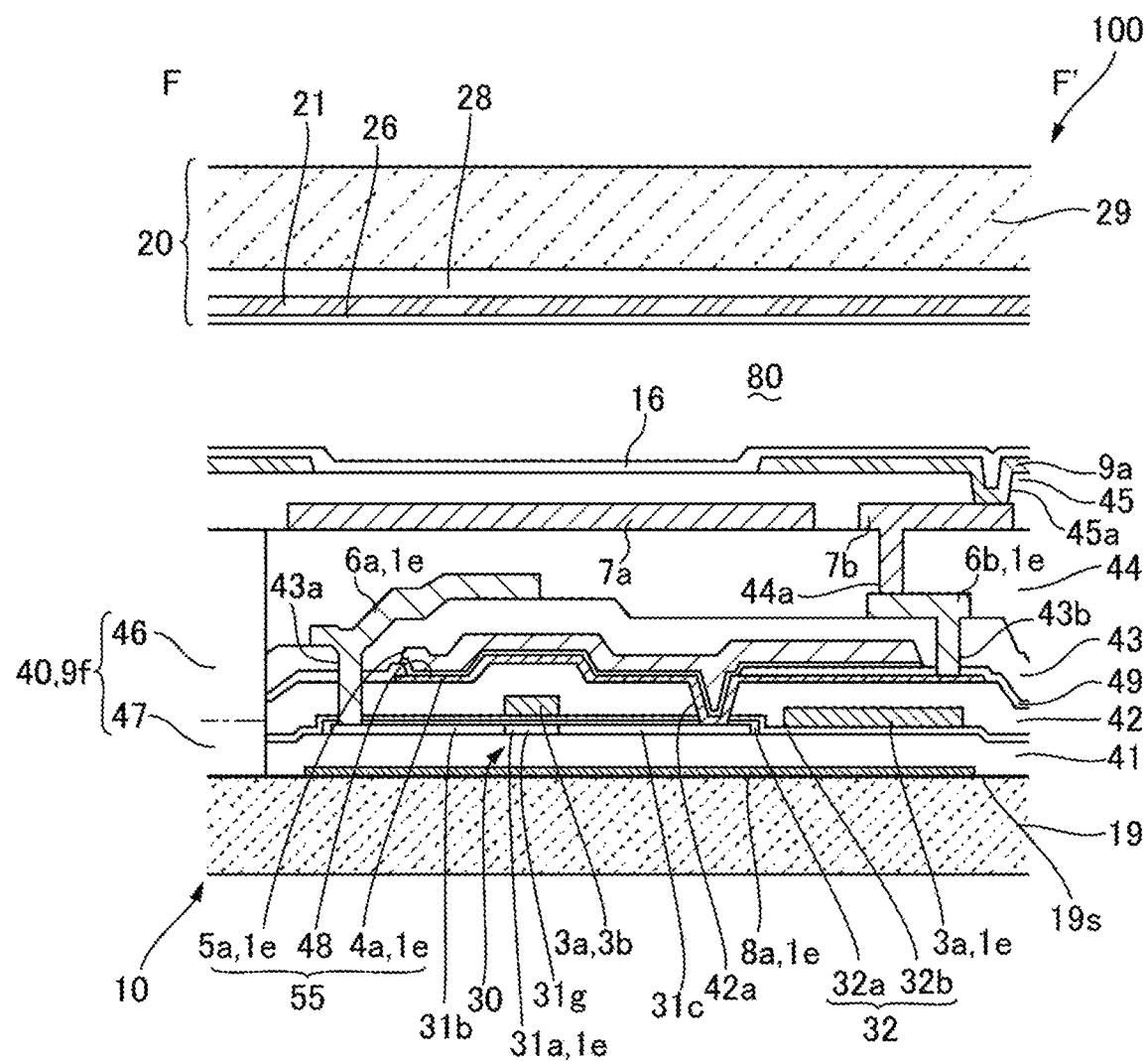
FIG. 5 is a cross-sectional view of the electro-optical device illustrated in FIG. 1, which is taken along the line F-F'.

FIG. 4 is a plan view of the plurality of pixels that are adjacent to each other in the electro-optical device 100 illustrated in FIG. 1. FIG. 5 is a cross-sectional view of the electro-optical device 100 illustrated in FIG. 1, which is taken along the line F-F'. Note that, in FIG. 4, each layer is indicated by a line as described below. Further, as for the layers that have ends overlapping with each other in plan view, the positions of the ends are deviated in FIG. 4 for easy understanding of shapes and the like of the layers.

The first light shielding layer 8a: the thin and long dashed line

The semiconductor layer 31a: the thin and short dotted line

The scanning line 3a: the thick solid line

The drain electrode 4a: the thin solid line

The data line 6a and the relay electrode 6b: the thin long dashed short dashed line The capacitance line 5a: the thick long dashed short dashed line The second light shielding layer 7a and the relay electrode 7b: the thick long dashed double-short dashed line The pixel electrode 9a: the thick dashed line As illustrated in FIG. 4, on the one surface side of the first substrate 10, which faces the second substrate 20, the plurality of pixel electrodes 9a are formed, and the data lines 6a and the scanning lines 3a are formed along inter-pixel regions sandwiched by the pixel electrodes 9a that are adjacent to each other. The inter-pixel regions extend lengthwise and crosswise. The scanning lines 3a linearly extend along first inter-pixel regions of the inter-pixel regions, which extend in an X direction, and the data lines 6a linearly extend along second inter-pixel regions of the inter-pixel regions, which extend in a Y direction. Further, the pixel switching elements 30 are formed to correspond to intersections between the data lines 6a and the scanning lines 3a, and the pixel switching elements 30 are formed by using intersection regions between the data lines 6a and the scanning lines 3a and the vicinities of the intersection regions. The capacitance lines 5a are formed on the first substrate 10, and a common potential Vcom is applied to the capacitance lines 5a. The capacitance lines 5a extend to overlap with the scanning lines 3a and the data lined 6a, and are formed to have a lattice shape. On an upper layer side of the pixel switching element 30, the second light shielding layer 7a is formed, and the second light shielding layer 7a extends to overlap with the data line 6a and the scanning line 3a. On a lower layer side of the pixel switching element 30, the first light shielding layer 8a is formed, and the first light shielding layer 8a extend to overlap with the scanning line 3a and the data line 6a.

As illustrated in FIG. 5, on the first substrate 10, the first light shielding layer 8a including a conductive film such as a conductive polysilicon film, a metal silicide film, a metal film, or a metal compound film is formed on the one surface 19s side of the substrate main body 19. The first light shielding layer 8a includes, for example, a light shielding film of tungsten silicide (WSi), tungsten, or titanium nitride, and prevents the light from entering the semiconductor layer 31a and causing an erroneous operation in the pixel switching element 30 due to photoelectric current. The first light shielding layer 8a may be configured as a scanning line. In this case, the following configuration to be described later is obtained. That is, the gate electrode 3b and the first light shielding layer 8a are brought into conduction with each other.

On the first substrate 10, on an upper layer side of the first light shielding layer 8a, a transmissive inter-layer insulating film 41 including, for example, a silicon oxide film is formed. On an upper layer side of the inter-layer insulating film 41, the pixel switching element 30 including the semiconductor layer 31a is formed. The pixel switching element 30 is a Thin Film Transistor (TFT), which includes the semiconductor layer 31a and the gate electrode 3b. The semiconductor layer 31a has long sides oriented in an extending direction of the data line 6a. The gate electrode 3b extends in a direction orthogonal to the longitudinal direction of the semiconductor layer 31a, and overlaps with a central part of the semiconductor layer 31a in the longitudinal direction. In this embodiment, the gate electrode 3b includes a part of the scanning line 3a. The pixel switching element 30 includes a transmissive gate insulating layer 32 between the semiconductor layer 31a and the gate electrode 3b. The semiconductor layer 31a includes a channel region 31g facing the gate electrode 3b via the gate insulating layer 32, and also includes a source region 31b and a drain region 31c on one side and the other side of the channel region 31g, respectively. The pixel switching element 30 has an LDD structure. Thus, on both the sides of the channel region 31g, each of the source region 31b and the drain region 31c has a low-concentration region. In a region adjacent to a side opposite to the channel region 31g with respect to the low-concentration region, each of the source region 31b and the drain region 31c has a high-concentration region.

The semiconductor layer 31a includes, for example, a polysilicon film (polycrystalline silicon film). The gate insulating layer 32 has a two-layer structure including a first gate insulating layer 32a including a silicon oxide film that is obtained by thermally oxidizing the semiconductor layer 31a, and a second gate insulating layer 32b including a silicon oxide film that is formed by using, for example, the low pressure CVD method. The gate electrode 3b and the scanning line 3a include a conductive film such as a conductive polysilicon film, a metal silicide film, a metal film, or a metal compound film.

On an upper layer side of the gate electrode 3b, a transmissive inter-layer insulating film 42 including, for example, a silicon oxide film is formed. On an upper layer of the inter-layer insulating film 42, a drain electrode 4a is formed. The drain electrode 4a includes a conductive film such as a conductive polysilicon film, a metal silicide film, a metal film, or a metal compound film. The drain electrode 4a is formed to have a part overlapping with the drain region 31c of the semiconductor layer 31a, and is brought into conduction with the drain region 31c via a contact hole 42a passing through the inter-layer insulating film 42 and the gate insulating layer 32.

On an upper layer side of the drain electrode 4a, a transmissive etching stopper layer 49 including, for example, a silicon oxide film and a transmissive dielectric layer 48 are formed. On an upper layer side of the dielectric layer 48, the capacitance line 5a is formed. As the dielectric layer 48, a silicon compound such as a silicon oxide film or a silicon nitride film may be used. In addition, a dielectric layer having a high dielectric constant, such as an aluminum oxide film, a titanium oxide film, a tantalum oxide film, a niobium oxide film, a hafnium oxide film, a lantern oxide film, or a zirconium oxide film may be used. The capacitance line 5a includes a conductive film such as a conductive polysilicon film, a metal silicide film, a metal film, or a metal compound film. The capacitance line 5a overlaps with the drain electrode 4a via the dielectric layer 48, and forms the retaining capacity 55.

On an upper layer side of the capacitance line 5a, a transmissive inter-layer insulating film 43 including, for example, a silicon oxide film is formed. On an upper layer side of the inter-layer insulating film 43, the data line 6a and the relay electrode 6b are formed of the same conductive film. The data line 6a and the relay electrode 6b include a conductive film such as a conductive polysilicon film, a metal silicide film, a metal film, or a metal compound film. The data line 6a is brought into conduction with the source region 31b via a contact hole 43a passing through the inter-layer insulating film 43, the etching stopper layer 49, the inter-layer insulating film 42, and the gate insulating layer 32. The relay electrode 6b is brought into conduction with the drain electrode 4a via a contact hole 43b passing through the inter-layer insulating film 43 and the etching stopper layer 49.

On an upper layer side of the data line 6a and the relay electrode 6b, a transmissive inter-layer insulating film 44 including, for example, a silicon oxide film is formed. On an upper layer side of the inter-layer insulating film 44, the second light shielding layer 7a and the relay electrode 7b are formed of the same conductive film. The inter-layer insulating film 44 has a flattened surface. The second light shielding layer 7a and the relay electrode 7b include a conductive film such as a conductive polysilicon film, a metal silicide film, a metal film, or a metal compound film. The relay electrode 7b is brought into conduction with the relay electrode 6b via a contact hole 44a passing through the inter-layer insulating film 44. The second light shielding layer 7a extends to overlap with the data line 6a. Note that, the second light shielding layer 7a may be brought into conduction with the capacitance line 5a and used as a shielding layer.

On an upper layer side of the second light shielding layer 7a and the relay electrode 7b, a transmissive inter-layer insulating film 45 including, for example, a silicon oxide film is formed. On an upper layer side of the inter-layer insulating film 45, the pixel electrode 9a including an ITO film is formed. A contact hole 45a reaching the relay electrode 7b is formed in the inter-layer insulating film 45. The pixel electrode 9a is electrically connected to the relay electrode 7b via the contact hole 45a. As a result, the pixel electrode 9a is electrically connected to the drain region 31c via the relay electrode 7b, the relay electrode 6b, and the drain electrode 4a. The inter-layer insulating film 45 has a flattened surface. On a surface side of the pixel electrode 9a, the first transmissive orientation film 16 including a polymide or an inorganic orientation film is formed.

Configuration of Wave Guide 9f

Figure 6:
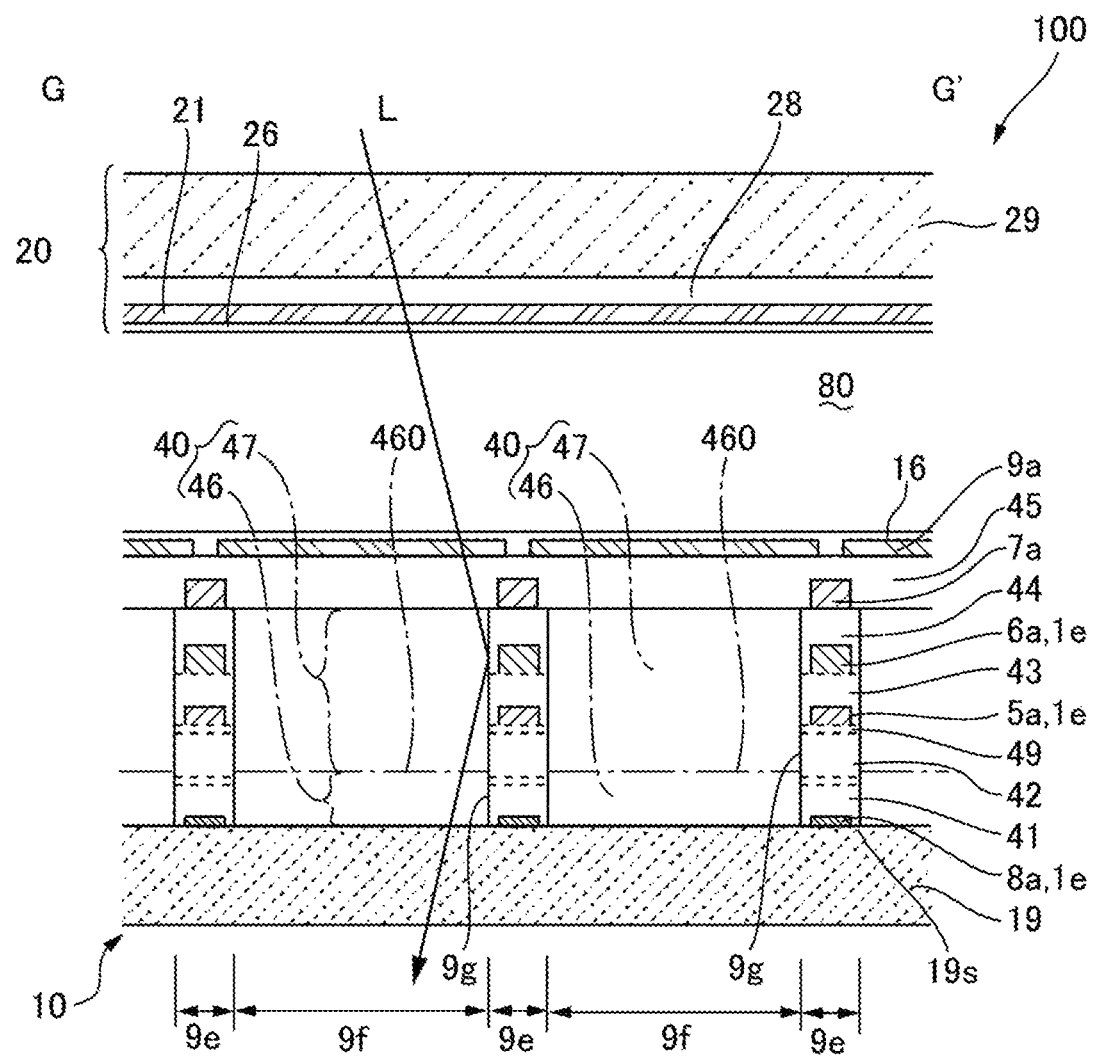
FIG. 6 is a cross-sectional view illustrating the electro-optical device being cut at a position corresponding to the arrow G-G' in FIG. 4.

FIG. 6 is a cross-sectional view illustrating the electro-optical device 100 being cut at a position corresponding to the arrow G-G' in FIG. 4. As illustrated in FIG. 4 and FIG. 6, in the electro-optical device 100, between the first substrate 10 (the substrate main body 19) and the pixel electrodes 9a, the first light shielding layer 8a, the semiconductor layer 31a, the scanning line 3a, the drain electrode 4a, the capacitance line 5a, the data line 6a, and the relay electrode 6b extend along the edge of the pixel electrodes 9a in plan view. Such wirings each form a light shielding body 1e.

In the electro-optical device 100 according to this embodiment, between the first substrate 10 (the substrate main body 19) and the pixel electrode 9a, a transmissive wall portion 9e (first insulating body), which covers the light shielding body 1e and extends to have an edge overlapping with the pixel electrode(s) 9a in plan view, is formed. Therefore, a portion surrounded by the wall portion 9e corresponds to a recessed portion 9g overlapping with the pixel electrode(s) 9a. The semiconductor layer 31a, the scanning line 3a, the drain electrode 4a, the capacitance line 5a, the data line 6a, and the relay electrode 6b are formed among the inter-layer insulating films 41, 42, 43, and 44. The wall portion 9e includes portions of the inter-layer insulating films 41, 42, 43, and 44, being patterned into a frame shape along the edge of the pixel electrode 9a in plan view. In this embodiment, the recessed portion 9g reaches the substrate main body 19, and has a bottom portion including the substrate main body 19.

The recessed portion 9g is filled with an insulating transmissive body 40 (second insulating body), and forms an opening region, which the light can pass through, in a region overlapping with the pixel electrode(s) 9a in plan view. A surface of the transmissive body 40 on a side opposite to the first substrate 10 and a surface of the wall portion 9e on a side opposite to the first substrate 10 (surface of the inter-layer insulating film 44 on a side opposite to the first substrate 10) form a continuous flat surface. On the flat surface on the side opposite to the first substrate 10, the second light shielding layer 7a, the relay electrode 7b, the inter-layer insulating film 45, the pixel electrodes 9a, and the first orientation film 16 are sequentially formed.

The wall portion 9e has a width larger than a width of the light shielding body 1e (the first light shielding layer 8a, the semiconductor layer 31a, the scanning line 3a, the drain electrode 4a, the capacitance line 5a, the data line 6a, and the relay electrode 6b). Therefore, the light shielding body 1e has both the sides covered with the wall portions 9e in the width direction. Therefore, the light shielding body 1e is not exposed at side surfaces of the wall portion 9e, and the light shielding body 1e is not brought into contact with the transmissive body 40. Thus, all the side surfaces of the recessed portion 9g are boundary surfaces 40a between the wall portion 9e and the transmissive body 40.

Here, the wall portion 9e (the inter-layer insulating films 41, 42, 43, and 44) is formed of a silicon oxide film ($SiO_2$), and has a refractive index of 1.46 to visible light having a wave length of 550 nm. Meanwhile, the transmissive body 40 includes a material having a high refractive index such as a silicon oxynitride film (SiON) and a silicon nitride film (SiN), which is higher than the refractive index of the wall portion 9e. In this embodiment, the transmissive body 40 is formed of a silicon oxynitride film, and has a refractive index of 1.64 to visible light having a wave length of 550 nm. Therefore, the boundary surfaces 40a between the transmissive body 40 and the wall portion 9e function as reflective surfaces. Thus, in the opening region, the transmissive body 40 surrounded by the boundary surfaces 40a (reflective surfaces) function as the wave guide 9f. In this embodiment, the boundary surfaces 40a between the transmissive body 40 and the wall portion 9e have an angle falling within a range of 90°±10° with respect to the first substrate 10.

In the electro-optical device 100 configured as described above, the light formed as a substantially parallel light flux enters from the second substrate 20 side. However, this incident light contains a component, which is deviated from a direction perpendicular to the pixel electrode 9a and enters obliquely. Even in this case, the wave guide 9f causes the light entering perpendicularly to the pixel electrode 9a to advance as is and to contribute to the display, and at the same time, causes the light entering in the oblique direction with respect to the pixel electrode 9a to advance in a direction of contributing to the display.

Specifically, according to the Snell's laws, in a case where the boundary surfaces 40a between the transmissive body 40 and the wall portion 9e form an angle of 90° with respect to the first substrate 10, and also in a case where, in the wave guide 9f, the incident light L entering the boundary surfaces 40a has an incident angle equal to or larger than 62° (a case where the incident light L enters the pixel electrode 9a at an incident angle equal to smaller than 28° (obtained by 90°-62°)), the incident light L is totally reflected on the boundary surfaces 40a to the transmissive body 40 side, and does not enter the wall portion 9e. Note that, even in a case where the boundary surfaces 40a between the transmissive body 40 and the wall portion 9e form an angle deviated from 90° with respect to the first substrate 10, substantially the entire light entering the wave guide 9f can be caused to advance in the direction of contributing to the display as long as the angle is perpendicular or approximately perpendicular, for example, the angle falling within a range of 90°±10°. Further, even in a case where the reflection, which is not the total reflection, occurs on the boundary surfaces 40a, the wave guide 9f significantly increases a ratio of the incident light to be used for the display.

Here, the transmissive body 40 includes a first transmissive film 46 provided in the recessed portion 9g and a second transmissive film 47 laminated on the first transmissive film 46 in the recessed portion 9g on a side opposite to the first substrate 10. Each of the first transmissive film 46 and the second transmissive film 47 is brought into contact with the side surface of the wall portion 9e, and form the boundary surface 40a. In this embodiment, the transmissive body 40 has a two-layer structure including the first transmissive film 46 and the second transmissive film 47.

The first transmissive film 46 has a refractive index equal to that of the second transmissive film 47. In this embodiment, the first transmissive film 46 and the second transmissive film 47 are formed of the same material (silicon oxynitride film). Substantially, an optical boundary surface is not present between a surface 460 of the first transmissive film 46 on the side opposite to the first substrate 10 and the second transmissive film 47. However, the first transmissive film 46 is subjected to dry etching in a process of forming, and hence it can be found that the boundary is present between the first transmissive film 46 and the second transmissive film 47 when being observed with an electron microscope and the like.

Manufacturing Method for Electro-Optical Device 100

Figure 7:
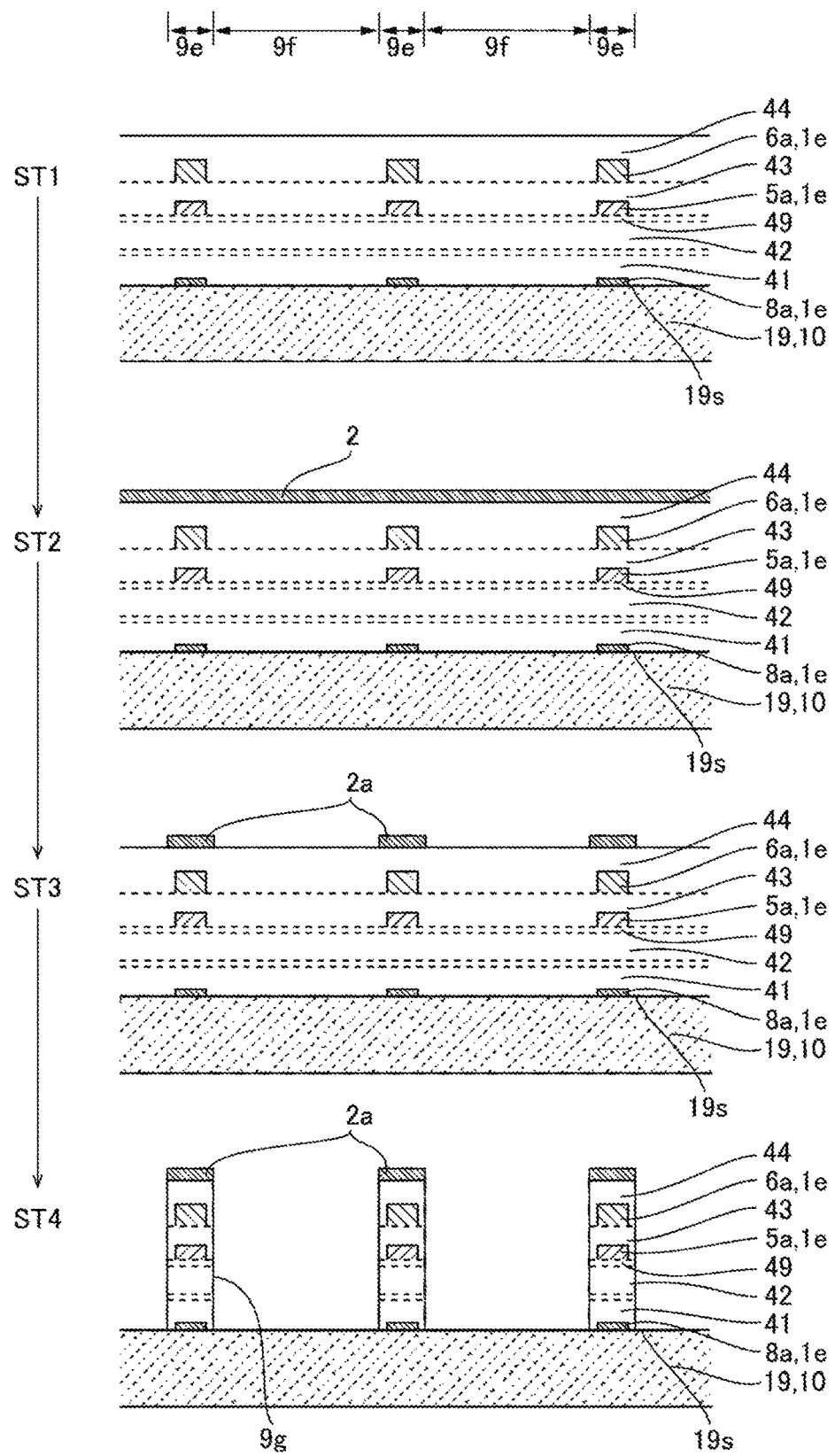
FIG. 7 is a cross-sectional view illustrating steps in a manufacturing method for an electro-optical device according to Exemplary Embodiment 1 of the invention.
Figure 8:
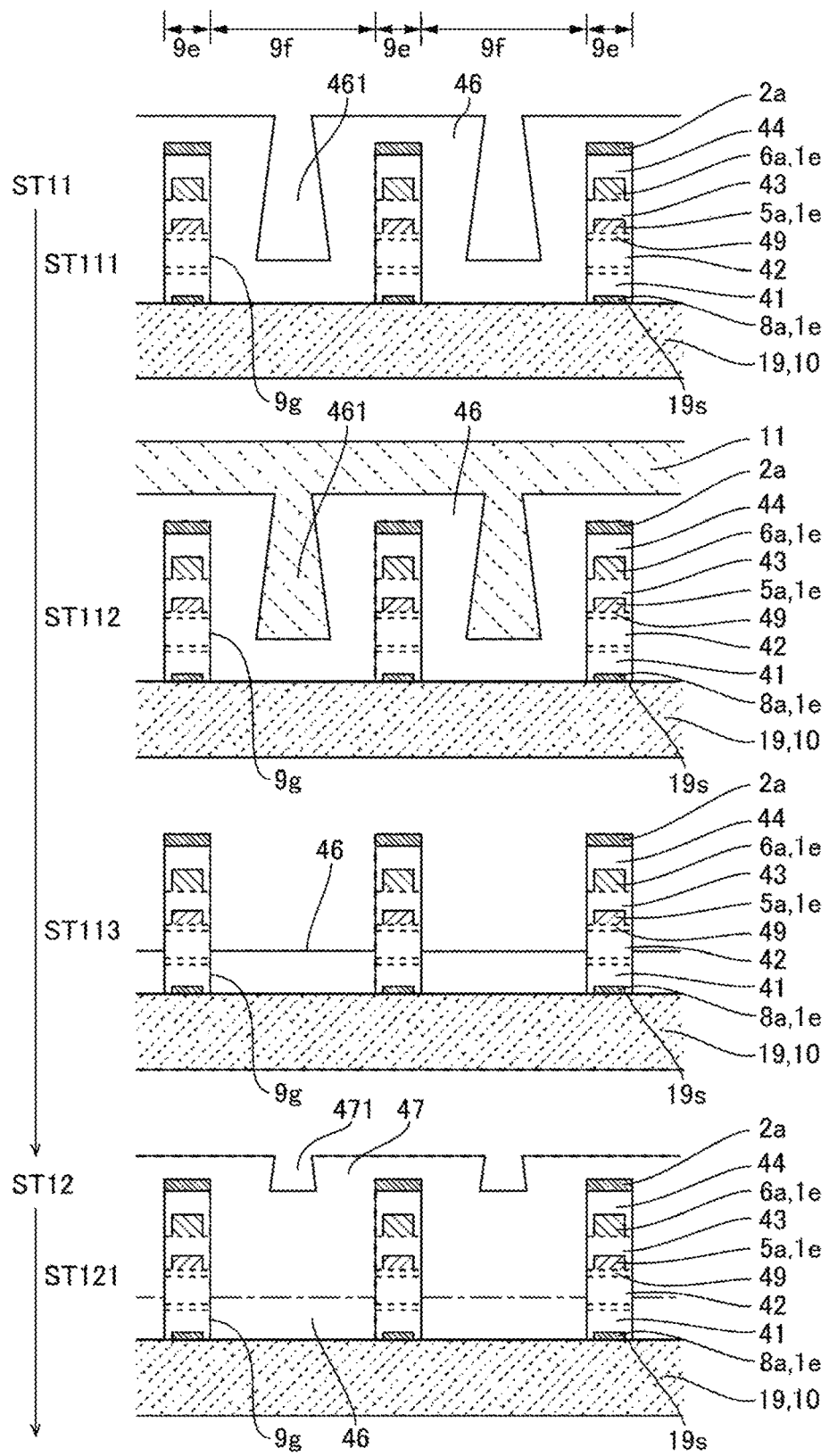
FIG. 8 is a cross-sectional view illustrating steps in the manufacturing method for an electro-optical device according to Exemplary Embodiment 1 of the invention.
Figure 9:
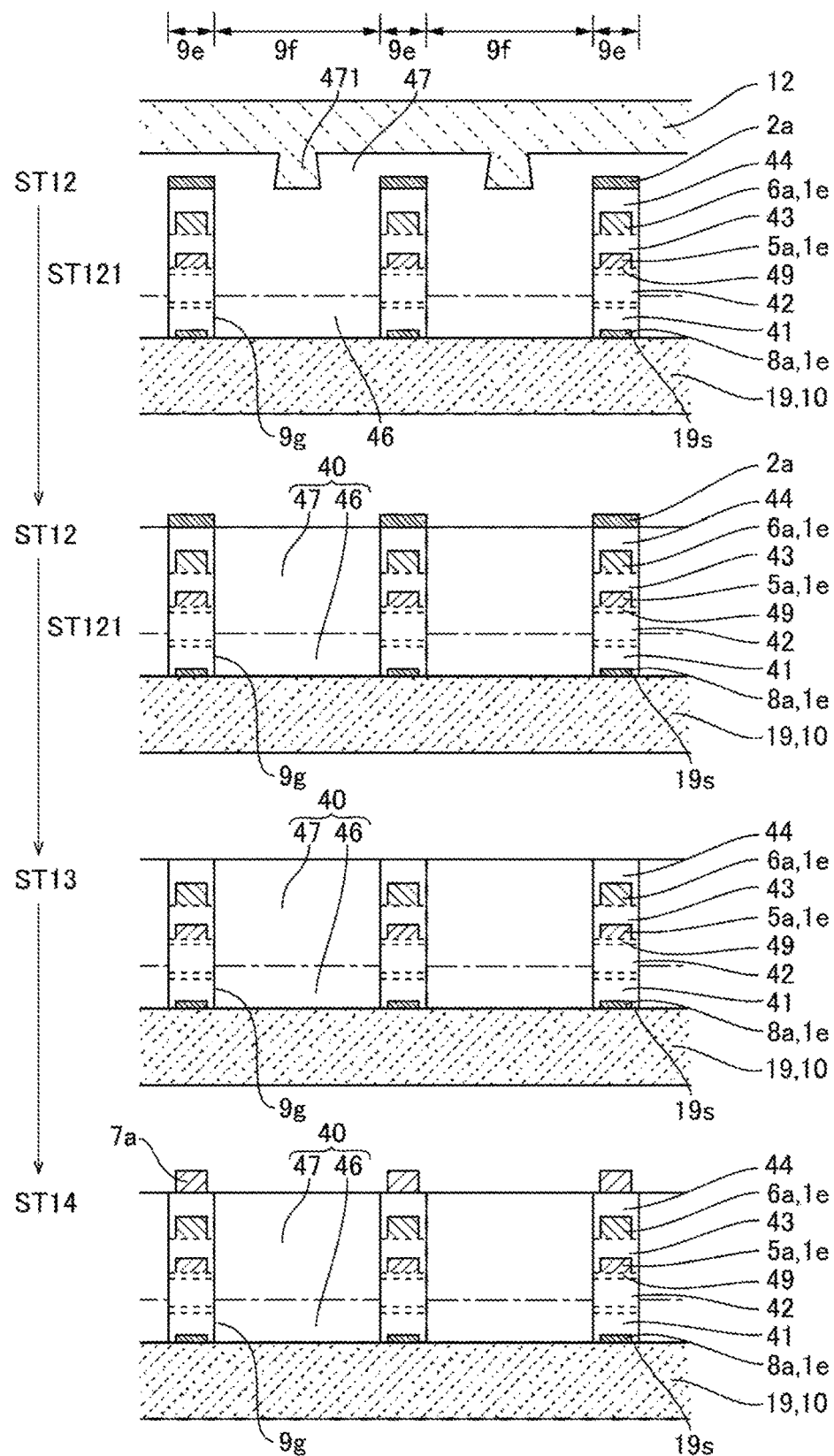
FIG. 9 is a cross-sectional view illustrating steps in the manufacturing method for an electro-optical device according to Exemplary Embodiment 1 of the invention.

Each of FIG. 7, FIG. 8, and FIG. 9 is a cross-sectional view illustrating steps in the manufacturing method for the electro-optical device 100 according to Exemplary Embodiment 1 of the invention. In the manufacturing of the electro-optical device 100 according to this embodiment, after the light shielding body 1e and the wall portion 9e are formed in the steps illustrated in FIG. 7, the transmissive body 40 is formed in the recessed portion 9g surrounded by the wall portion 9e in the steps illustrated in FIG. 8 and FIG. 9.

More specifically, members from the first light shielding layer 8a to the inter-layer insulating film 44 are formed in Step ST1 illustrated in FIG. 7, and after that, an inorganic film 2 for a hard mask is formed on a surface of the inter-layer insulating film 44 on a side opposite to the first substrate 10 in Step ST2 illustrated in FIG. 7. In this embodiment, the inorganic film 2 is formed of a tungsten silicide film. Next, in Step ST3 illustrated in FIG. 7, under a state in which a resist mask (not illustrated) is formed on a surface of the inorganic film 2 on a side opposite to the first substrate 10, the inorganic film 2 is patterned to form a hard mask 2a in a region overlapping with the light shielding body 1e in plan view. Next, in Step ST4 illustrated in FIG. 7, etching is performed through an opening of the hard mask 2a on the inter-layer insulating film 44 and the like to form the recessed portion 9g. As a result, the wall portion 9e, which covers the light shielding body 1e including the first light shielding layer 8a, the semiconductor layer 31a, the scanning line 3a, the capacitance line 5a, and the data line 6a, is formed in a frame shape.

Next, as illustrated in FIG. 8 and FIG. 9, the recessed portion 9g is filled with the transmissive body 40. In this embodiment, first, the first transmissive film 46 is formed to fill the recessed portion 9g in a first step ST11, and after that, the first transmissive film 46 is partially removed in a thickness direction from a side opposite to the first substrate 10. Next, in a second step ST12, the second transmissive film 47 is formed to cover the first transmissive film 46 remaining in the recessed portion 9g.

More specifically, in the first step ST11, a first film formation step ST111, a first resist layer formation step ST112, and a first etch-back step ST113 are performed. In the first film formation step ST111, the first transmissive film 46 (silicon oxynitride film) is formed by using, for example, the plasma enhanced chemical vapor deposition method (CVD method) to fill the recessed portion 9g. In the first resist layer formation step ST112, a first resist layer 11 is formed on the first transmissive film 46 on a side opposite to the first substrate 10. In the first etch-back step ST113, the first resist layer 11 is etched back from a side opposite to the first substrate 10. In this embodiment, in the first etch-back step ST113, the entire first resist layer 11 is etched back to be removed. As for the etch-back, dry etching is performed by using etching gas including fluorine and oxygen.

In the first film formation step ST111, due to influence of the recessed portion 9g, a defect 461 having a large recessed shape, which has a bottom portion positioned on an inner side with respect to the recessed portion 9g, is formed in a surface of the first transmissive film 46. However, in the first resist layer formation step ST112, when the first resist layer 11 is formed, the flowability of the resist material causes the defect 461 to be filled with the first resist layer 11, and a surface of the first resist layer 11 becomes a flat surface. Therefore, after the first etch-back step ST113 is performed, and the entire first resist layer 11 is etched back to be removed, the portion of the first transmissive film 46, which form the defect 461 is removed. Thus, the first transmissive film 46 without the defect 461 remains at a bottom portion of the recessed portion 9g.

In the second step ST12, a second film formation step ST121, a second resist layer formation step ST122, and a second etch-back step ST123 are performed. In the second film formation step ST121, the second transmissive film 47 is formed by using, for example, the plasma enhanced chemical vapor deposition method to cover the first transmissive film 46 remaining in the recessed portion 9g after the first step ST11. In the second resist layer formation step ST122, a second resist layer 12 is formed on the second transmissive layer 47 on a side opposite to the first substrate 10. In the second etch-back step ST123, the second resist layer 12 is etched back from a side opposite to the first substrate 10, and the surface of the second transmissive film 47 on the side opposite to the first substrate 10 is flattened.

In the second film formation step ST121, due to the influence of the recessed portion 9g, a defect 471 having a recessed shape is formed in the surface of the second transmissive film 47. However, a bottom portion of the defect 471 is positioned on an outer side with respect to the recessed portion 9g. Further, in the second resist layer formation step ST122, when the second resist layer 12 is formed, the flowability of the resist material causes the defect 471 to be filled with the second resist layer 12, and a surface of the second resist layer 12 becomes a flat surface. Therefore, after the second etch-back step ST123 is performed, and the entire second resist layer 12 is etched back to be removed, the surface of the second transmissive film 47 becomes a flat surface. Further, the portion of the second transmissive film 47, which forms the defect 471, is removed. Accordingly, the recessed portion 9g is filled with the transmissive body 40 having a two-layer structure including the first transmissive film 46 without the defect 461 and the second transmissive film 47 without the defect 471. Therefore, voids are less liable to be formed in the transmissive body 40.

After that, in a third step ST13, the hard mask 2a is removed by wet etching or dry etching. Then, in a fourth step ST14, the second light shielding layer 7a and the relay electrode 7b (not illustrated) are formed. Then, as illustrated in FIG. 6, the inter-layer insulating film 45, the pixel electrodes 9a, and the first orientation film 16 are sequentially formed.

Main Effects of Exemplary Embodiment 1

As described above, in the electro-optical device 100 according to this embodiment and in the manufacturing method for the electro-optical device 100, on the first substrate 10, the light shielding body 1e extending along the edge of the pixel electrode 9a in plan view is covered with the transmissive wall portion 9e, and the recessed portion 9g surrounded by the wall portion 9e is filled with the transmissive body 40 having a refractive index higher than that of the wall portion 9e. Therefore, in the electro-optical device 100, the boundary surfaces 40a between the transmissive body 40 and the wall portion 9e are present extending along the edge of the pixel electrode 9a in plan view. Between the first substrate 10 and the pixel electrode 9a, the wave guide 9f is formed to overlap with the pixel electrode 9a in plan view. Therefore, even when the light entering from the second substrate 20 side advances obliquely toward the wall portion 9e, the light is reflected, on the boundary surfaces 40a between the transmissive body 40 and the wall portion 9e, toward the first substrate 10. Thus, the light utilization efficiency can be improved. Further, the transmissive body 40 filling the recessed portion 9g has a multi-layer structure including the first transmissive film 46 and the second transmissive film 47. Thus, after the first transmissive film 46 is formed, the first transmissive film 46 is partially removed in the thickness direction. Accordingly, the first transmissive film 46 remains only in the bottom portion of the recessed portion 9g, and the defect 461 having a recessed shape disappears. Further, under a state in which the first transmissive film 46 remains in the bottom portion of the recessed portion 9g, the recessed portion 9g is reduced in aspect ratio. Therefore, when the second transmissive film 47 is formed, even in the case where the defect 471 having a recessed shape is formed in the second transmissive film 47, the defect 471 is positioned on the outer side with respect to the recessed portion 9g. Thus, the recessed portion 9g is filled with the transmissive body 40 having a two-layer structure including the first transmissive film 46 without the defect 461 and the second transmissive film 47 without the defect 471. In a case where a pixel size is reduced to obtain a high-definition image, the recessed portion 9g is increased in aspect ratio. However, according to this embodiment, even in a case where the recessed portion 9g is filled with the transmissive body 40, the voids are less liable to be formed in the transmissive body 40. Therefore, the light reflection on the voids is less liable to occur in the transmissive body 40.

Further, the wall portion 9e includes the plurality of inter-layer insulating films (the inter-layer insulating films 41, 42, 43, and 44) laminated between the first substrate 10 and the pixel electrode 9a. The light shielding body 1e includes the wirings or electrodes formed between two or more layers of the plurality of inter-layer insulating films (the inter-layer insulating films 41, 42, 43, and 44). In such a configuration, even in the case where the pixel size is reduced to obtain a high definition image, a height of the wall portion 9e is not changed. Accordingly, the recessed portion 9g is increased in aspect ratio. Even in this case, according to this embodiment, the voids are less liable to be formed in the transmissive body 40 filling the recessed portion 9g. Therefore, dispersion of light and the like caused by the voids are less liable to occur in the transmissive body 40.

Further, the first transmissive film 46 has a refractive index equal to that of the second transmissive film 47. Thus, the reflection on the boundary surface between the first transmissive film 46 and the second transmissive film 47 (surface 460 of the first transmissive film 46) can be prevented.

Further, the light shielding body 1e further includes the semiconductor layer 31a of the pixel switching element 30 formed between the inter-layer insulating films 41 and 42 of the plurality of inter-layer insulating films 41, 42, 43, and 44. That is, the wall portion 9e includes the inter-layer insulating films 41 and 42 covering the semiconductor layers 31a from both the sides. The region in which the transmissive body 40 is arranged in the thickness direction includes the region in which the semiconductor layer 31a is arranged in the thickness direction. Thus, the semiconductor layer 31a is covered with the wall portion 9e, and therefore the light to advance toward the semiconductor layer 31a is reflected on the boundary surfaces 40a between the transmissive body 40 and the wall portion 9e. Therefore, the light is less liable to enter the semiconductor layer 31a, and hence an erroneous operation and the like due to photoelectric current are less liable to occur in the pixel switching element 30. Further, even in a case where the light exiting from the first substrate 10 is reflected by, for example, a polarizing plate and enters the first substrate 10 again, such return light can be prevented from entering the semiconductor layer 31a by the first light shielding layer 8a and the wave guide 9f.

Further, the incident light is totally reflected on the boundary surfaces 40a between the transmissive body 40 and the wall portion 9e, and hence the light utilization efficiency can further be improved. Further, the boundary surfaces 40a between the transmissive body 40 and the wall portion 9e form an angle falling within a range of 90°±10° with respect to the first substrate 10. Thus, the total reflection is likely to occur on the boundary surfaces 40a between the transmissive body 40 and the wall portion 9e.

Further, the wall portion 9e has a width larger than that of the light shielding body 1e (the first light shielding layer 8a, the semiconductor layer 31a, the scanning line 3a, the drain electrode 4a, the capacitance line 5a, the data line 6a, the relay electrode 6b). Thus, the light shielding body 1e has both the sides covered with the wall portion 9e in the width direction. Therefore, the light shielding body 1e is not exposed at the side surfaces of the wall portion 9e. As a result, the light entering the wave guide 9f can be prevented from being reflected on the edge of the light shielding body 1e not to contribute to the display.

Exemplary Embodiment 2

Figure 10:
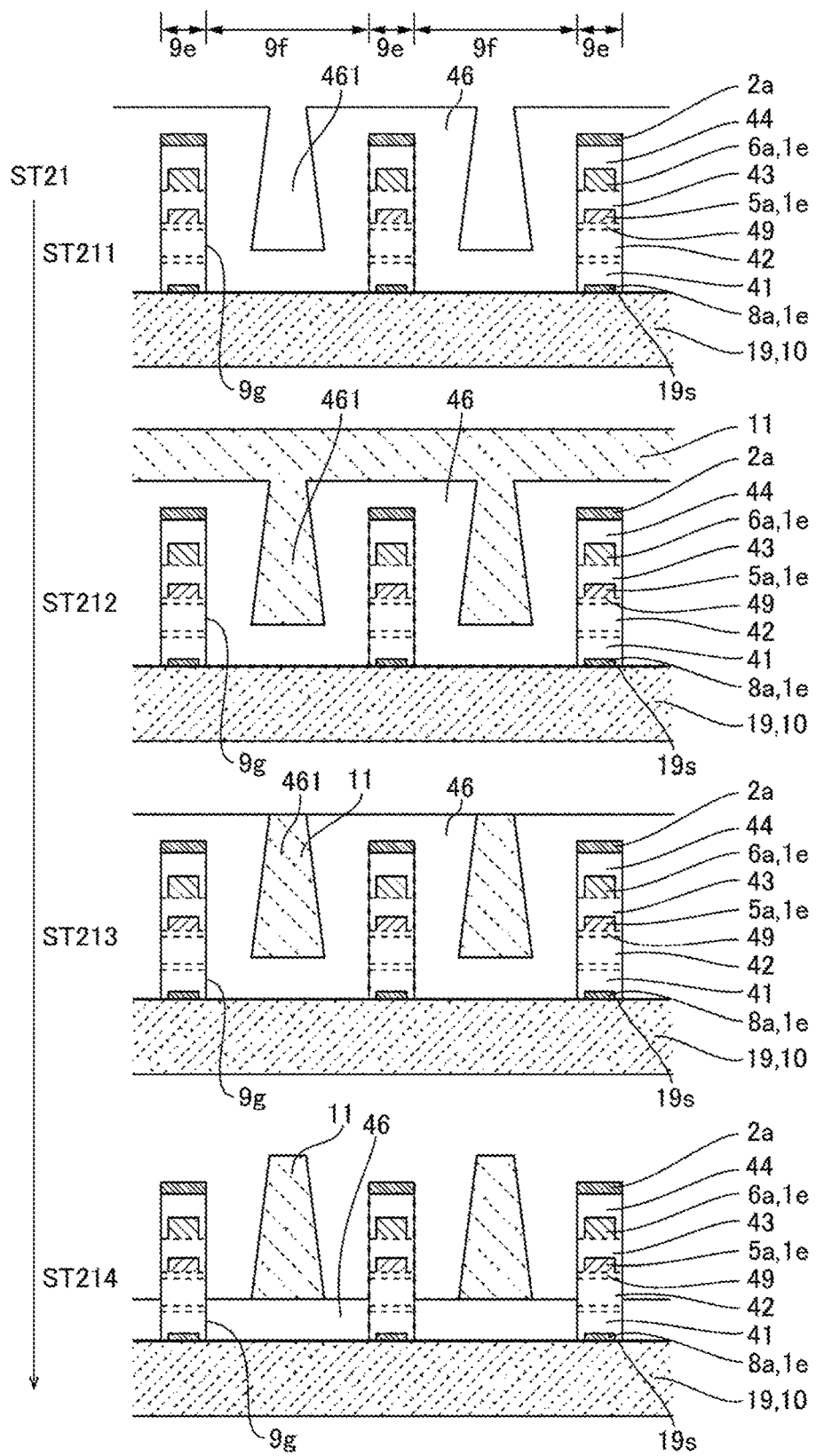
FIG. 10 is a cross-sectional view illustrating steps in a manufacturing method for an electro-optical device according to Exemplary Embodiment 2 of the invention.
Figure 11:
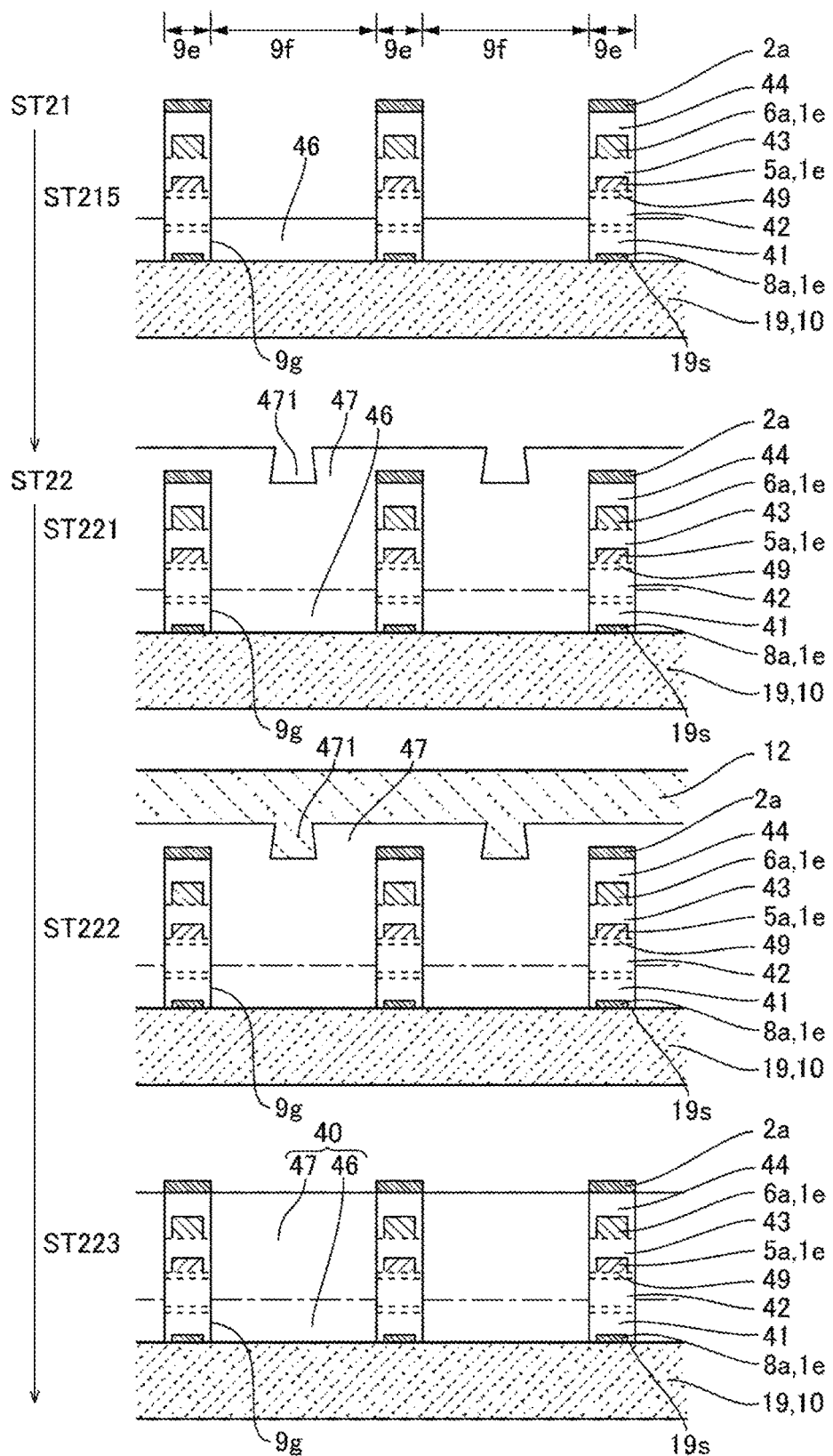
FIG. 11 is a cross-sectional view illustrating steps in the manufacturing method for an electro-optical device according to Exemplary Embodiment 2 of the invention.

Each of FIG. 10 and FIG. 11 is a cross-sectional view illustrating steps in a manufacturing method for an electro-optical device 100 according to Exemplary Embodiment 2 of the invention. Note that the basic configuration of Exemplary Embodiment 2 and Exemplary Embodiment 3 to be described later is the same as the configuration of Exemplary Embodiment 1, and thus common portions have the same reference symbols and description of the common portions will be omitted.

In this embodiment, when manufacturing the electro-optical device 100 according to this embodiment, which is described with reference to FIG. 6 and the like, similarly to Exemplary Embodiment 1, the light shielding body 1e and the wall portion 9e are formed in the steps illustrated in FIG. 7. After that, in the steps illustrated in FIG. 10 and FIG. 11, the transmissive body 40 is formed in the recessed portion 9g surrounded by the wall portion 9e. At this time, the hard mask 2a is caused to remain on an end of the wall portion 9e on the side opposite to the first substrate 10.

In this embodiment, similarly to Exemplary Embodiment 1, when the recessed portion 9g is filled with the transmissive body 40, first, in a first step ST21, the first transmissive film 46 is formed to fill the recessed portion 9g. Then, the first transmissive film 46 is partially removed in the thickness direction from the side opposite to the first substrate 10. Next, in a second step ST22, the second transmissive film 47 is formed to cover the first transmissive film 46 remaining in the recessed portion 9g.

More specifically, in the first step ST21, a first film formation step ST211, a first resist layer formation step ST212, and a first etch-back step ST213 are performed. In the first film formation step ST211, the first transmissive film 46 is formed to fill the recessed portion 9g. In the first resist layer formation step ST212, the first resist layer 11 is formed on the first transmissive film 46 on a side opposite to the first substrate 10. In the first etch-back step ST213, the first resist layer 11 is etched back from a side opposite to the first substrate 10. In this embodiment, in the first etch-back step ST213, the etch-back is performed until the first transmissive film 46 is exposed from the entire first resist layer 11. Then, after the first etch-back step ST213, in an etching step ST214, the part of the first transmissive film 46 in the thickness direction, which is exposed from the first resist layer 11, is removed by etching. After that, in an asking step ST215, the first resist layer 11 is removed. Note that, in the etching step ST214, the etching with high selectivity is performed to the first resist layer 11 and the first transmissive film 46.

In the first film formation step ST211, due to the influence of the recessed portion 9g, the defect 461 having a large recessed shape is formed in the surface of the first transmissive film 46. However, in the first resist layer formation step ST212, when the first resist layer 11 is formed, the flowability of the resist material causes the defect 461 to be filled with the first resist layer 11, and the surface of the first resist layer 11 becomes a flat surface. Thus, when the first etch-back step ST213 is performed in which the etch-back is performed until the first resist layer 11 remains only in the defect 461, a surface of the first resist layer 11 remaining in the defect 461 on a side opposite to the first substrate 10 and a surface of the first transmissive film 46, which is exposed from the first resist layer 11, on a side opposite to the first substrate 10 form a continuous surface. Further, in the etching step ST214, the first transmissive film 46 is selectively removed to the same position as the bottom portion of the defect 461 or to the position lower than the bottom portion of the defect 461. After that, in the asking step ST215, when the first resist layer 11 is removed, the first transmissive film 46 without the defect 461 remains in the bottom portion of the recessed portion 9g.

Similarly to Exemplary Embodiment 1, in the second step ST22, a second film formation step ST221, a second resist layer formation step ST222, and a second etch-back step ST223 are performed. In the second film formation step ST221, the second transmissive film 47 is formed to cover the first transmissive film 46 remaining in the recessed portion 9g after the first step ST21. In the second resist layer formation step ST222, the second resist layer 12 is formed on the second transmissive layer 47 on a side opposite to the first substrate 10. In the second etch-back step ST223, the second resist layer 12 is etched back from a side opposite to the first substrate 10, and the surface of the second transmissive film 47 on the side opposite to the first substrate 10 is flattened.

In the second film formation step ST221, due to the influence of the recessed portion 9g, the defect 471 having a recessed shape is formed in the surface of the second transmissive film 47. However, a bottom portion of the defect 471 is positioned on an outer side with respect to the recessed portion 9g. Further, in the second resist layer formation step ST222, when the second resist layer 12 is formed, the flowability of the resist material causes the defect 471 to be filled with the second resist layer 12, and a surface of the second resist layer 12 becomes a flat surface. Thus, when the second etch-back step ST223 is performed in which the entire second resist layer 12 is etched back to be removed, the portion of the second transmissive film 47, which forms the defect 471, is removed. Accordingly, the recessed portion 9g is filled with the transmissive body 40 having a two-layer structure including the first transmissive film 46 without the defect 461 and the second transmissive film 47 without the defect 471. Therefore, voids are less liable to be formed in the transmissive body 40.

After that, as described with reference to FIG. 9, the hard mask 2a is removed in the third step ST13, and the second light shielding layer 7a and the like are then formed in the fourth step ST14. After that, as illustrated in FIG. 6, the inter-layer insulating film 45, the pixel electrodes 9a, and the first orientation film 16 are sequentially formed.

Also in this embodiment, similarly to Exemplary Embodiment 1, between the first substrate 10 and the pixel electrode 9a, the transmissive body 40 filling the recessed portion 9g has a multi-layer structure including the first transmissive film 46 and the second transmissive film 47 when the wave guide 9f is formed to overlap with the pixel electrode 9a in plan view. Therefore, after the first transmissive film 46 is formed, the first transmissive film 46 is partially removed in the thickness direction. Accordingly, the defect 461 that may cause the voids disappears. Further, under a state in which the first transmissive film 46 remains in the bottom portion of the recessed portion 9g, the recessed portion 9g is reduced in aspect ratio. Therefore, when the second transmissive film 47 is formed, even in the case where the defect 471 having a recessed shape is formed in the second transmissive film 47, the defect 471 is positioned on the outer side with respect to the recessed portion 9g. Thus, the recessed portion 9g is filled with the transmissive body 40 having a two-layer structure including the first transmissive film 46 without the defect 461 and the second transmissive film 47 without the defect 471. In a case where a pixel size is reduced to obtain a high-definition image, the recessed portion 9g is increased in aspect ratio. However, according to this embodiment, even in a case where the recessed portion 9g is filled with the transmissive body 40, the voids are less liable to be formed in the transmissive body 40. Such effect and the like similar to those in Exemplary Embodiment 1 can be achieved.

Exemplary Embodiment 3

Figure 12:
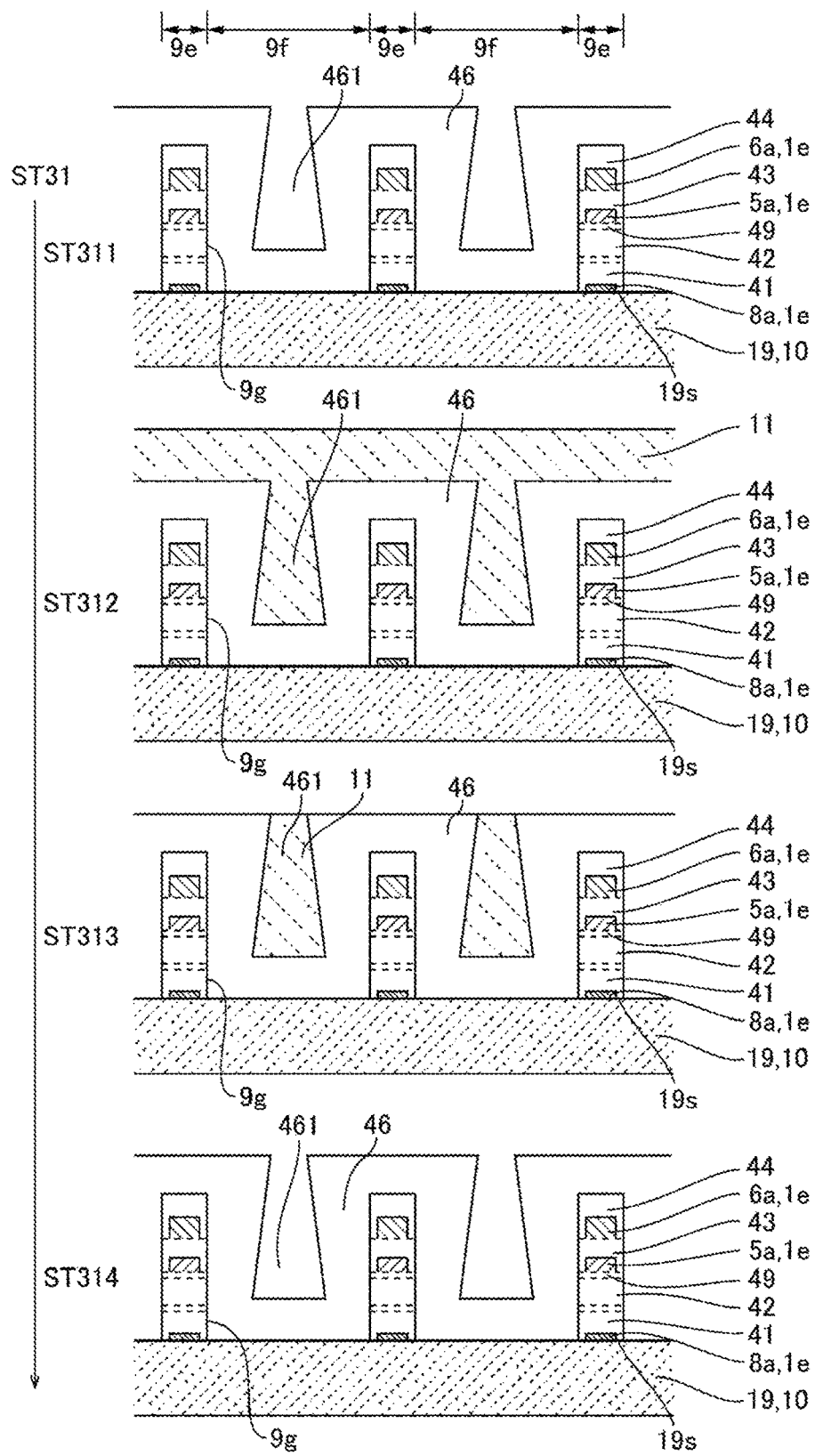
FIG. 12 is a cross-sectional view illustrating steps in a manufacturing method for an electro-optical device according to Exemplary Embodiment 3 of the invention.
Figure 13:
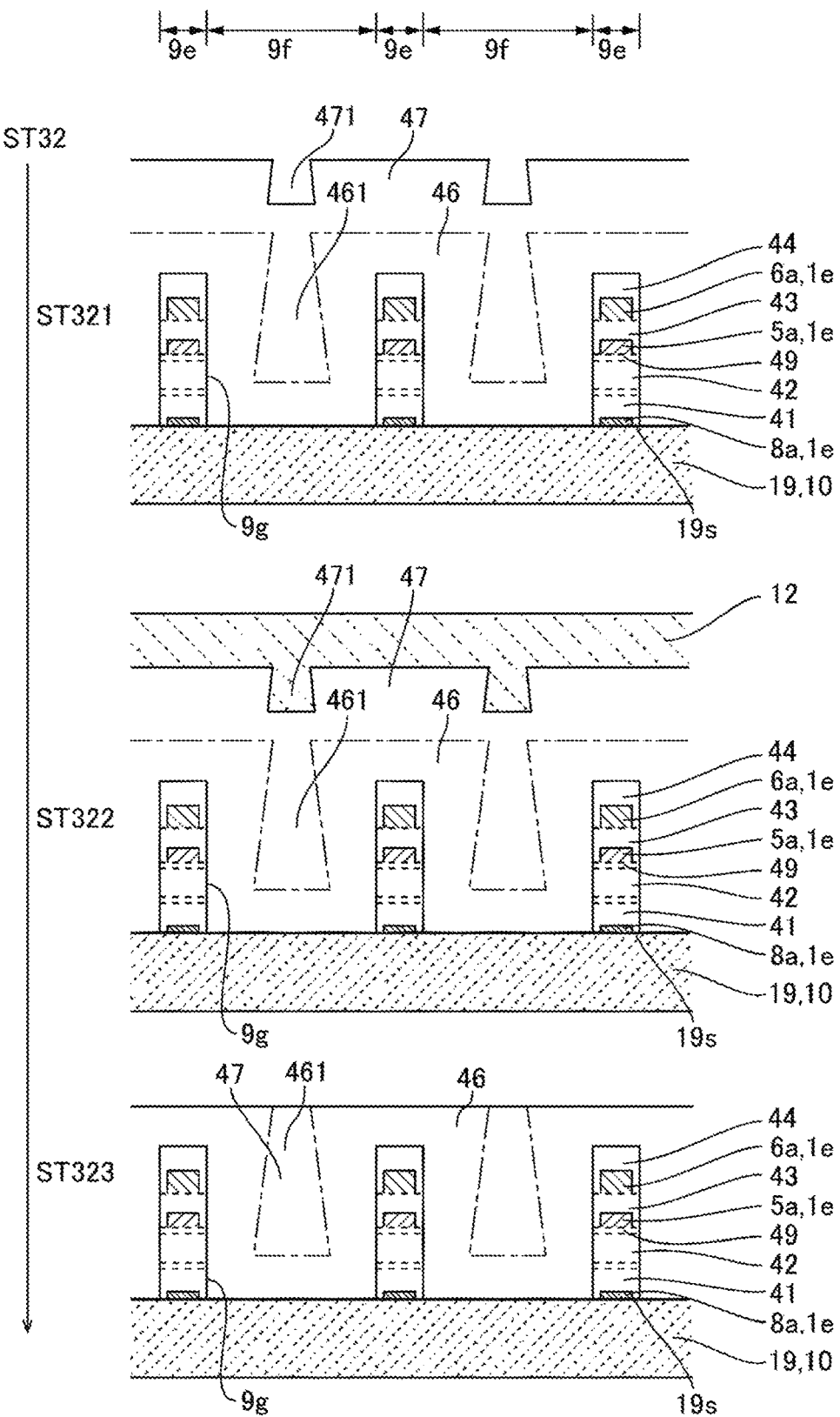
FIG. 13 is a cross-sectional view illustrating steps in the manufacturing method for an electro-optical device according to Exemplary Embodiment 3 of the invention.

Each of FIG. 12 and FIG. 13 is a cross-sectional view illustrating steps in a manufacturing method for an electro-optical device 100 according to Exemplary Embodiment 3 of the invention. In this embodiment, when manufacturing the electro-optical device 100 described with reference to FIG. 6 and the like, similarly to Exemplary Embodiment 1, the light shielding body 1e and the wall portion 9e are formed in the steps illustrated in FIG. 7. After that, in the steps illustrated in FIG. 12 and FIG. 13, the transmissive body 40 is formed in the recessed portion 9g surrounded by the wall portion 9e. In this embodiment, after the wall portion 9e is formed, the hard mask 2a is removed. Under the state without the hard mask 2a, the steps illustrated in FIG. 12 and FIG. 13 are performed.

Also in this embodiment, similarly to Exemplary Embodiment 1, when the recessed portion 9g is filled with the transmissive body 40, first, in a first step ST31, the first transmissive film 46 is formed to fill the recessed portion 9g. Then, the first transmissive film 46 is partially removed in the thickness direction from the side opposite to the first substrate 10. Next, in a second step ST32, the second transmissive film 47 is formed to cover the first transmissive film 46 remaining in the recessed portion 9g.

More specifically, in the first step ST31, a first film formation step ST311, a first resist layer formation step ST312, and a first etch-back step ST313 are performed. In the first film formation step ST311, the first transmissive film 46 is formed to fill the recessed portion 9g. In the first resist layer formation step ST312, the first resist layer 11 is formed on the first transmissive film 46 on a side opposite to the first substrate 10. In the first etch-back step ST313, the first resist layer 11 is etched back from a side opposite to the first substrate 10. In this embodiment, in the first etch-back step ST313, the etch-back is stopped on the outer side with respect to the recessed portion 9g, and the first transmissive film 46 is partially removed in the thickness direction. After the first etch-back step ST313, the first resist layer 11 is removed in an asking step ST314.

In the first film formation step ST311, due to the influence of the recessed portion 9g, the defect 461 having a large recessed shape is formed in the surface of the first transmissive film 46. However, in the first resist layer formation step ST312, when the first resist layer 11 is formed, the flowability of the resist material causes the defect 461 to be filled with the first resist layer 11, and the surface of the first resist layer 11 becomes a flat surface. Thus, in the first etch-back step ST313, the etch-back is stopped on the outer side with respect to the recessed portion 9g, and the first transmissive film 46 is partially removed in the thickness direction. Accordingly, the surface of the first resist layer 11 remaining in the defect 461 on the side opposite to the first substrate 10 and the surface of the first transmissive film 46, which is exposed from the first resist layer 11, on the side opposite to the first substrate 10 form a continuous surface. Further, in the asking step ST314, when the first resist layer 11 is removed, the defect 461 is opened. However, the defect 461 is reduced in aspect ratio.

Similarly to Exemplary Embodiment 1, in the second step ST32, a second film formation step ST321, a second resist layer formation step ST322, and a second etch-back step ST323 are performed. In the second film formation step ST321, the second transmissive film 47 is formed to cover the first transmissive film 46 remaining in the recessed portion 9g after the first step ST31. In the second resist layer formation step ST322, the second resist layer 12 is formed on the second transmissive layer 47 on a side opposite to the first substrate 10. In the second etch-back step ST323, the second resist layer 12 is etched back from a side opposite to the first substrate 10, and the surface of the second transmissive film 47 on the side opposite to the first substrate 10 is flattened.

In the second film formation step ST321, the defect 461 of the first transmissive film 46 can be filled, but due to the influence of the defect 461, the defect 471 having a recessed shape is formed in the surface of the second transmissive film 47. Even in this case, the bottom portion of the defect 471 is positioned on the outer side with respect to the recessed portion 9g. Further, in the second resist layer formation step ST322, when the second resist layer 12 is formed, the flowability of the resist material causes the defect 471 to be filled with the second resist layer 12, and a surface of the second resist layer 12 becomes a flat surface. Thus, when the second etch-back step ST323 is performed in which the entire second resist layer 12 is etched back to be removed, the portion of the second transmissive film 47, which forms the defect 471, is removed. Accordingly, the recessed portion 9g is filled with the transmissive body 40 having a two-layer structure including the first transmissive film 46 without the defect 461 and the second transmissive film 47 without the defect 471. Therefore, voids are less liable to be formed in the transmissive body 40.

After that, as described with reference to FIG. 9, the hard mask 2a is removed in the third step ST13, the second light shielding layer 7a is then formed in the fourth step ST14. After that, as illustrated in FIG. 6, the inter-layer insulating film 45, the pixel electrodes 9a, and the first orientation film 16 are sequentially formed.

Also in this embodiment, similarly to Exemplary Embodiment 1, between the first substrate 10 and the pixel electrode 9a, the transmissive body 40 filling the recessed portion 9g has a multi-layer structure including the first transmissive film 46 and the second transmissive film 47 when the wave guide 9f is formed to overlap with the pixel electrode 9a in plan view. Thus, after the first transmissive film 46 is formed, the first transmissive film 46 is partially removed in the thickness direction. Accordingly, the defect 461 that may cause the voids is opened largely, and hence the defect that may cause the voids can be filled when the second transmissive film 47 is formed. Therefore, even when the recessed portion 9g has a large aspect ratio, the voids are less liable to be formed in the transmissive body 40. Such effect and the like similar to those in Exemplary Embodiment 1 can be achieved.

Exemplary Embodiment 4

Figure 14:
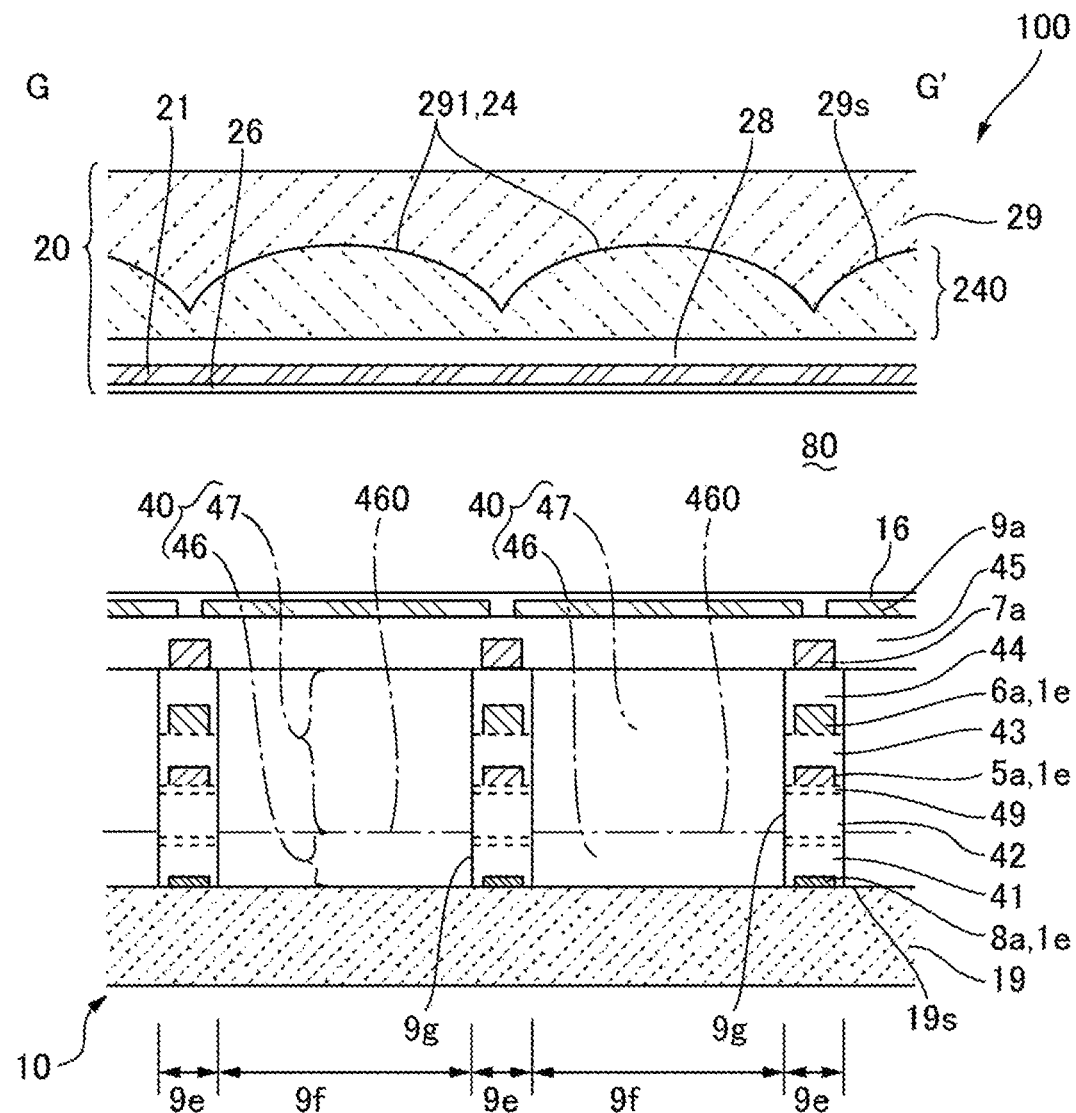
FIG. 14 is a cross-sectional view of an electro-optical device according to Exemplary Embodiment 4 of the invention.

FIG. 14 is a cross-sectional view of an electro-optical device 100 according to Exemplary Embodiment 4 of the invention. As illustrated in FIG. 14, on the second substrate 20 of the electro-optical device 100 according to this embodiment, a plurality of lens surfaces 291, which are concave surfaces and overlap with each of the plurality of pixel electrodes 9a in plan view, are formed on one surface 29s of the substrate main body 29. Further, on the one surface 29s of the substrate main body 29, a transmissive lens layer 240 and the transmissive protection layer 28 are sequentially laminated in this order. The common electrode 21 is formed on the protection layer 28 on a side opposite to the substrate main body 29. The substrate main body 29 has a refractive index different from that of the lens layer 240, and the lens surfaces 291 and the lens layer 240 form lenses 24. In this embodiment, the lens layer 240 has the refractive index larger than the refractive index of the substrate main body 29. For example, the substrate main body 29 is formed of a quartz substrate (silicon oxide, $SiO_2$), and has the refractive index of 1.48. Meanwhile, the lens layer 240 is formed of a silicon oxynitride film (SiON), and has the refractive index from 1.58 to 1.68. Thus, the lenses 24 have positive power (positive refractive power) for converging light from a light source. Therefore, the incident light from the second substrate 20 side can be condensed to the wave guide 9f of the first substrate 10. As a result, the light utilization efficiency can be improved.

Exemplary Embodiment 5

Figure 15:
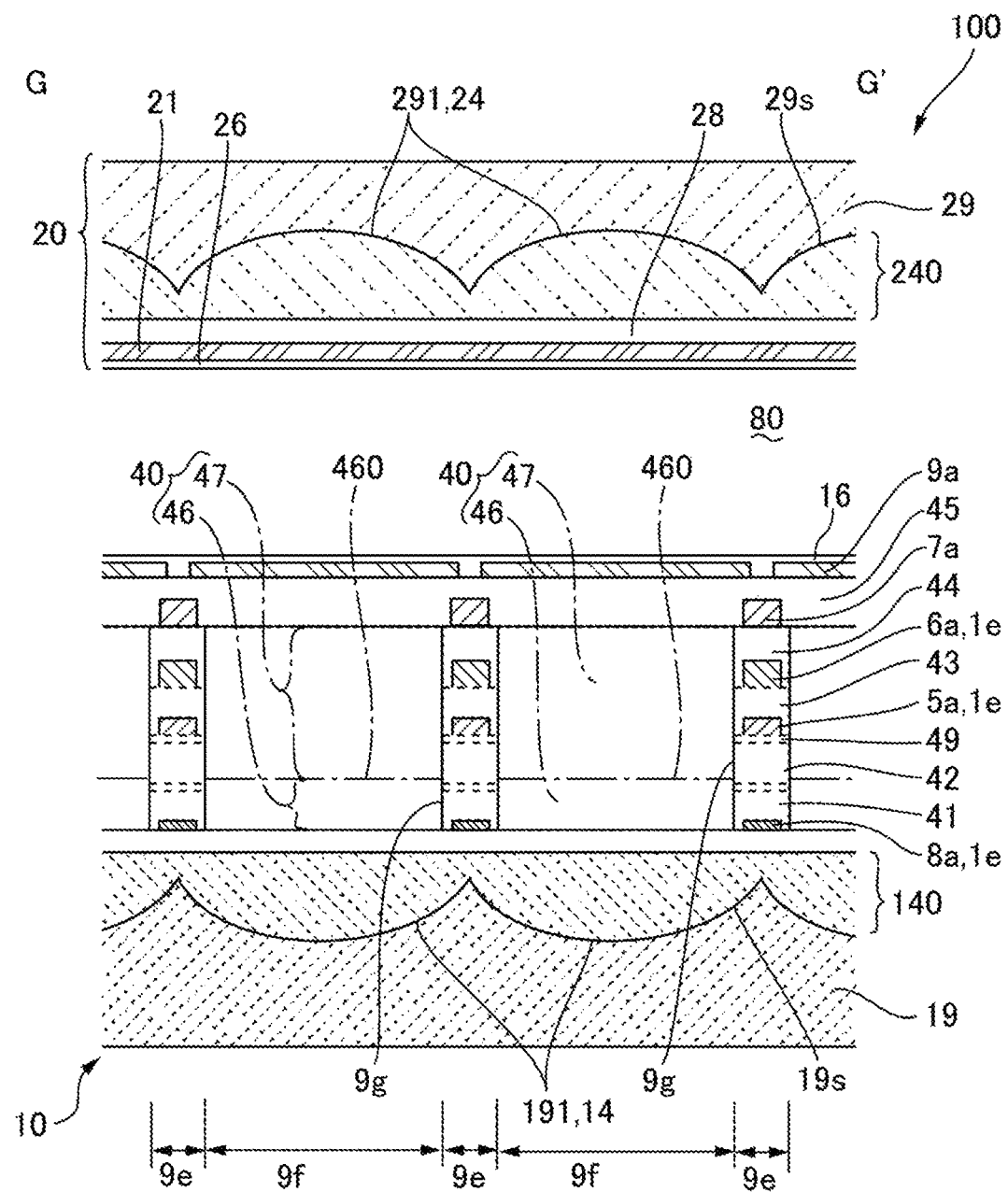
FIG. 15 is a cross-sectional view of an electro-optical device according to Exemplary Embodiment 5 of the invention.

FIG. 15 is a cross-sectional view of an electro-optical device 100 according to Exemplary Embodiment 5 of the invention. As illustrated in FIG. 15, in the electro-optical device 100 according to this embodiment, similarly to Exemplary Embodiment 4, the lenses 24 overlapping with each of the plurality of pixel electrodes 9a are formed on the second substrate 20. In this embodiment, on the one surface 19s of the substrate main body 19, a plurality of lens surfaces 191, which are concave surfaces and overlap with each of the plurality of pixel electrodes 9a in plan view, are formed. Further, on the one surface 19s of the substrate main body 19, the transmissive lens layer 140 is laminated to cover the lens surfaces 191. The substrate main body 19 has a refractive index different from that of the lens layer 140, and the lens surfaces 191 and the lens layer 140 form lenses 14. In this embodiment, the lens layer 140 has the refractive index larger than the refractive index of the substrate main body 19. For example, the substrate main body 19 is formed of a quartz substrate (silicon oxide, $SiO_2$), and has the refractive index of 1.48. Meanwhile, the lens layer 140 is formed of a silicon oxynitride film (SiON), and has the refractive index from 1.58 to 1.68. Thus, the lenses 14 have positive power (positive refractive power) for converging the light. Thus, the lenses 14 collimate the light exiting from the first substrate 10. As a result, vignetting of the light and the like in a projection optical system of a projection-type display device to be described later are less liable to occur, and hence bright display can be performed.

Other Exemplary Embodiments

The number and the like of the insulating layers (inter-layer insulating films) forming the wall portion 9e may be changed as needed. That is, the region of the wall portion 9e in the height direction, the region of the recessed portion 9g in plan view, and the like may be changed as needed. For example, in the above-mentioned exemplary embodiments, the inter-layer insulating films have four layers, but the wall portion 9e may have a five-layer structure including the inter-layer insulating film 45. In this case, the following mode is employed. That is, the surface of the wall portion 9e and the surface of the inter-layer insulating film 45 form a continuous flat surface, and the pixel electrodes 9a are provided on the flat surface formed of the surface of the wall portion 9e and the surface of the inter-layer insulating film 45. In this case, when the inter-layer insulating films have four or more layers, the recessed portion 9g is increased in aspect ratio. Thus, the effects of applying the invention are significant.

In the above-mentioned exemplary embodiments, the transmissive body 40 has a two-layer structure including the first transmissive film 46 and the second transmissive film 47. However, the following mode may be employed. That is, in the recessed portion 9g, a transmissive film is further laminated with the second transmissive film 47.

In the above-mentioned exemplary embodiments, description is given of the case where the incident light from the second substrate 20 side exits from the first substrate 10 side. However, even in a case where the incident light from the first substrate 10 side exits from the second substrate 20 side, the wave guide 9f can achieve the effect of improving the light utilization efficiency, or the like.

In the above-mentioned exemplary embodiments, the liquid crystal device is exemplified as the electro-optical device 100 including the wave guide 9f, but the invention is not limited to such mode. For example, the invention may be applied to other electro-optical devices such as an electro-phoretic display device and an organic electro-luminescence display device.

Configuration Example of Electronic Apparatus

Figure 16:
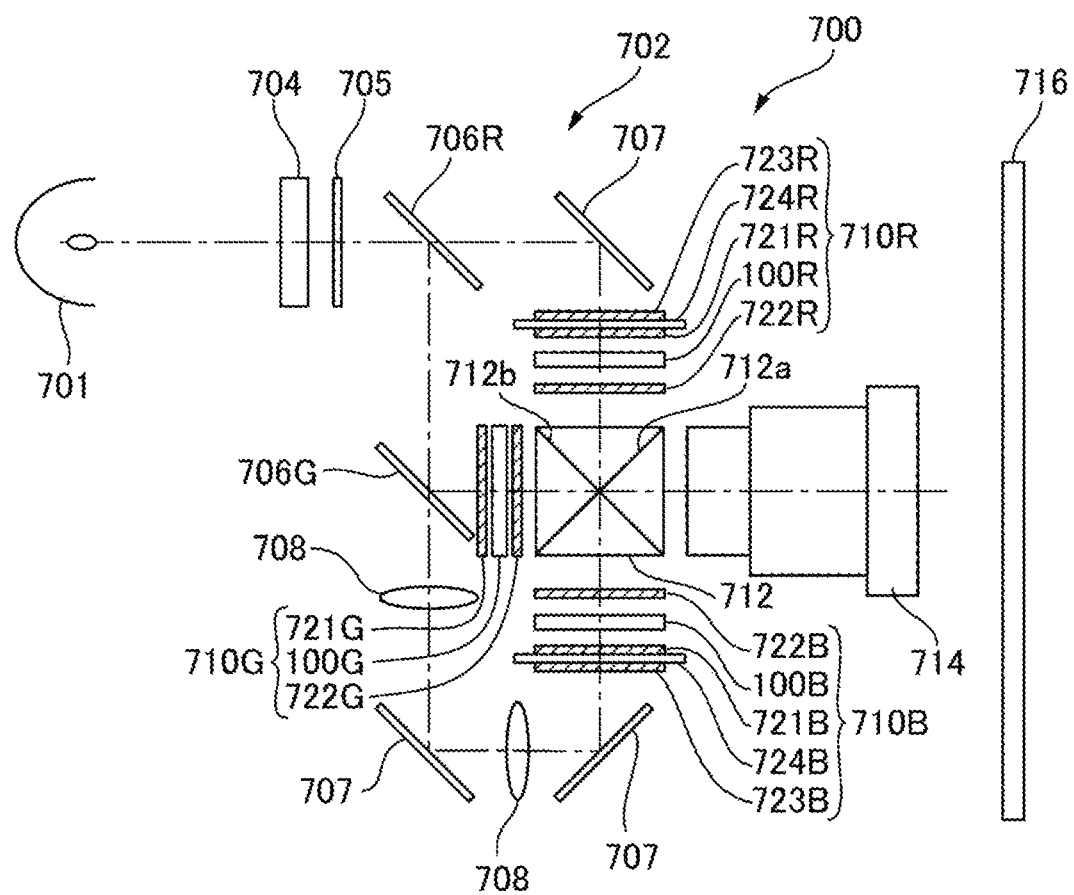
FIG. 16 is an explanatory diagram illustrating an optical system of an electronic apparatus including electro-optical devices to which the invention is applied.

FIG. 16 is an explanatory diagram illustrating an optical system of an electronic apparatus including the electro-optical devices 100 to which the invention is applied. In FIG. 16, a case where the electronic apparatus is configured as a projection-type display device (projector) is exemplified. As illustrated in FIG. 16, a projection-type display device 700 includes a light source portion 701, an integrator 704, a polarization conversion element 705, a color light separation and light-guiding optical system 702, three light valves 710R, 710G, and 710B as light modulation devices, a cross dichroic prism 712, and a projection optical system 714. The light valves 710R, 710G, and 710B include the electro-optical devices 100R, 100G, and 100B, respectively. Each of the electro-optical devices 100R, 100G, and 100B is the electro-optical device 100 to which the invention is applied.

The light source portion 701 is configured to supply light including red light being first color light (hereinafter referred to as "R light"), green light being second color light (hereinafter referred to as "G light"), and blue light being third color light (hereinafter referred to as "B light"). As the light source portion 701, for example, an extra-high pressure mercury lamp may be used.

The integrator 704 is configured to uniform illuminance distribution of the light emitted from the light source portion 701. The light having the uniformed illuminance distribution is converted to polarized light having a specific vibration direction, for example, to s-polarized light by the polarization conversion element 705. The light converted to the s-polarized light enters an B-light transmissive dichroic mirror 706R forming the color light separation and light guide optical system 702.

The color light separation and light guide optical system 702 includes the R-light transmissive dichroic mirror 706R, a B-light transmissive dichroic mirror 706G, three reflection mirrors 707, and two relay lenses 708. The B-light transmissive dichroic mirror 706R causes the R light to pass through and reflects the G light and the B light. The R light passing through the R-light transmissive dichroic mirror 706R enters the reflection mirror 707. The reflection mirror 707 bends a light path of the R light at 90°. The R light having the bent light path enters the light valve 710R for the R light.

The light valve 710R includes a λ/2 phase difference plate 723R, a glass plate 724R, a first polarizing plate 721R, the electro-optical device 100R, and a second polarizing plate 722R. The R light entering the light valve 710R has been converted to s-polarized light. The s-polarized light entering the light valve 710R passes through the first polarizing plate 721R as is, and enters the electro-optical device 100R. The s-polarized light entering the electro-optical device 100R is modulated in accordance with an image signal to be converted to p-polarized light. The R light converted to the p-polarized light through the modulation by the electro-optical device 100R exits from the second polarizing plate 722R. In this way, the R light modulated by the light valve 710R enters the cross dichroic prism 712. The λ/2 phase difference plate 723R and the first polarizing plate 721R are arranged to be brought into contact with the transmissive glass plate 724R, which does not change the polarizing direction. Note that, in FIG. 16, the second polarizing plate 722R is provided independently, but may be arranged on an emission surface of the electro-optical device 100R or may be arranged to be brought into contact with an incident surface of the cross dichroic prism 712.

The G light and the B light, which are reflected on the R-light transmissive dichroic mirror 706R, have light paths bent at 90°. The G light and the B light having the bent light paths enter the B-light transmissive dichroic mirror 706G. The B-light transmissive dichroic mirror 706G reflects the G light and causes the B light to pass through. The G light reflected on the B-light transmissive dichroic mirror 706G enters the light valve 710G for the G light. The light valve 710G for the G light includes the electro-optical device 100G, a first polarizing plate 721G, and a second polarizing plate 722G.

The G light entering the light valve 710G has been converted to s-polarized light. The s-polarized light entering the light valve 710G passes through the first polarizing plate 721G as is, and enters the electro-optical device 100G. The s-polarized light entering the electro-optical device 100G is converted to p-polarized light through modulation in accordance with an image signal. The G light converted to the p-polarized light through the modulation by the electro-optical device 100G exits from the second polarizing plate 722G. In this way, the G light modulated by the light valve 710G enters the cross dichroic prism 712.

The B light passing through the B-light transmissive dichroic mirror 706G enters the light valve 710B for the B light through the two relay lenses 708 and the two reflection mirrors 707. The light valve 710B modulates the B light in accordance with an image signal. The light valve 710B for the B light includes a λ/2 phase difference plate 723B, a glass plate 724B, a first polarizing plate 721B, the electro-optical device 100B, and a second polarizing plate 722B.

The B light entering the light valve 710B has been converted to s-polarized light. The s-polarized light entering the light valve 710B is converted to p-polarized light by the λ/2 phase difference plate 723B. The B light converted to the p-polarized light passes through the glass plate 724B and the first polarizing plate 721B as is, and enters the electro-optical device 100B. The p-polarized light entering the electro-optical device 100B is converted to s-polarized light through modulation in accordance with an image signal. The B light converted to the s-polarized light by the electro-optical device 100B exits from the second polarizing plate 722B, and enters the cross dichroic prism 712.

Two dichroic films 712a and 712b are arranged to cross with each other in the X shape to form the cross dichroic prism 712 being a color synthesis optical system. The dichroic film 712a reflects the B light, and causes the G light to pass through. The dichroic film 712b reflects the R light, and causes the G light to pass through. As described above, the cross dichroic prism 712 is configured to synthesize the R light, the G light, and the B light, which are modulated by the light valve 710R for the R light, the light valve 710G for the G light, and the light valve 710B for the B light, respectively.

The projection optical system 714 is configured to project the light synthesized by the cross dichroic prism 712 to a screen 716. In this manner, a full color image can be obtained on the screen 716. As described above, the above-mentioned electro-optical device 100 can be used for the projection-type display device 700 as an example.

Note that, the above-mentioned electro-optical device 100 may be used as a front projection-type display device for projecting a projection image from a viewing side and as a rear projection-type display device for projecting a projection image from a side opposite to the viewing side. Further, the invention may be applied to the electro-optical device 100 to be used for the projection-type display device 700 in which a solid light source such as laser elements or light emitting diodes is used as the light source portion 701.

Further, the electronic apparatus to which the electro-optical device 100 is applicable is not limited to the projection-type display device 700. For example, the electro-optical device 100 may be used as a projection-type head-up display (HUD), a direct viewing-type head-mounted display (HMD), and a display unit of an information terminal device such as an electronic book, a personal computer, a digital camera, a liquid crystal television, a view finder-type or a monitor direct viewing type video recorder, a car navigation system, an electronic note book, and POS.

The entire disclosure of Japanese Patent Application No. 2017-243575, filed Dec. 20, 2017 is expressly incorporated by reference herein.

What is claimed is:
1. An electro-optical device comprising:
   a first substrate being transmissive;
   a pixel electrode being transmissive and provided on one surface side of the first substrate;
   a light shielding body configured to extend between the first substrate and the pixel electrode and include an edge overlapping with the pixel electrode in plan view from a direction perpendicular to the first substrate, the light shielding body including a first light shielding film and a second light shielding film, the second light shielding film disposed between the pixel electrode and the first light shielding film;
   a wall portion having insulation property and configured to cover the light shielding body between the first substrate and the pixel electrode, and extend along an edge of the pixel electrode in the plan view, the wall portion including a first inter-layer insulating film covering the first light shielding film and a second inter-layer insulating film covering the second light shielding film, the first inter-layer insulating film having a first side surface in a region surrounded by the light shielding body, the second inter-layer insulating film having a second side surface in the region surrounded by the light shielding body; and
   a transmissive body having insulation property and a refractive index higher than a refractive index of the wall portion, the transmissive body being provided in a recessed portion surrounded by the wall portion, wherein
   the transmissive body includes a first transmissive film and a second transmissive film formed on the first transmissive film on a side opposite to the first substrate, the first transmissive film being in contact with the first side surface of the first inter-layer insulating film, the second transmissive film being in contact with the second side surface of the second inter-layer insulating film.

2. The electro-optical device according to claim 1, wherein
the first transmissive film has a refractive index equal to a refractive index of the second transmissive film.

3. The electro-optical device according to claim 1, wherein
the wall portion includes a plurality of inter-layer insulating films provided between the first substrate and the pixel electrode, and
the light shielding body includes a wiring or an electrode provided between two or more inter-layer insulating films of the plurality of inter-layer insulating films.

4. The electro-optical device according to claim 3, wherein
the light shielding body includes a semiconductor layer for a pixel switching element provided between adjacent films of the plurality of inter-layer insulating films.

5. The electro-optical device according to claim 1, wherein
a width of the wall portion is larger than a width of the light shielding body, and
both sides of the light shielding body in a width direction are covered by the wall portion.

6. The electro-optical device according to claim 1, wherein
a boundary surface between the wall portion and the transmissive body is forming with an angle falling within a range of $90°\pm10°$ with respect to the first substrate.

7. The electro-optical device according to claim 1, comprising:
a second substrate configured to face one surface of the first substrate; and
a liquid crystal layer provided between the first substrate and the second substrate.

8. An electronic apparatus comprising the electro-optical device according to claim 1.

9. The electro-optical device according to claim 1, wherein
the light shielding body includes a third light shielding film that is disposed between the pixel electrode and the first light shielding film,
the wall portion includes a third inter-layer insulating film covering the third light shielding film, the third inter-layer insulating film having a third side surface in the region surrounded by the light shielding body, and
the second transmissive film is in contact with the third side surface of the third inter-layer insulating film.

* * * * *